US011133963B1

(12) United States Patent
Zheng et al.

(10) Patent No.: US 11,133,963 B1
(45) Date of Patent: Sep. 28, 2021

(54) DSP CANCELLATION OF TRACK-AND-HOLD INDUCED ISI IN ADC-BASED SERIAL LINKS

(71) Applicant: Xilinx, Inc., San Jose, CA (US)

(72) Inventors: Kevin Zheng, San Jose, CA (US); Ronan Casey, Cork (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/011,595

(22) Filed: Sep. 3, 2020

(51) Int. Cl.
*H04L 25/03* (2006.01)
*H03M 1/12* (2006.01)
*H04B 1/12* (2006.01)

(52) U.S. Cl.
CPC .... *H04L 25/03057* (2013.01); *H03M 1/1245* (2013.01); *H04B 1/123* (2013.01)

(58) Field of Classification Search
CPC .... H04L 25/03057; H04L 2025/03617; H04B 10/6971; H04B 1/123; H03M 1/1245
See application file for complete search history.

(56) References Cited

U.S. PATENT DOCUMENTS

| 7,342,952 | B2 | 3/2008 | Smee et al. |
| 10,367,666 | B2 | 7/2019 | Zhang et al. |
| 10,911,060 | B1* | 2/2021 | Neto ..................... H03M 1/468 |
| 2007/0133719 | A1* | 6/2007 | Agazzi ............... H04B 10/6971 375/341 |
| 2007/0133722 | A1* | 6/2007 | Agazzi ............. H04L 25/03184 375/346 |
| 2013/0208782 | A1 | 8/2013 | Agrawal et al. |
| 2015/0085914 | A1 | 3/2015 | Kizer et al. |
| 2015/0207648 | A1* | 7/2015 | Palusa ..................... H04L 25/03 375/233 |

OTHER PUBLICATIONS

Sitthimahachaikul, Nattapol, et al., Canceling the ISI Due to Finite S/H Bandwidth in a Circular Buffer Forward Equalizer, IEEE Transactions on Circuits and Systems—II: Express Briefs, vol. 59, No. 3, pp. 188-192, Mar. 2012, 5 pages.

(Continued)

*Primary Examiner* — Sung S Ahn
(74) *Attorney, Agent, or Firm* — Craige Thompson, Thompson Patent Law

(57) ABSTRACT

Apparatus and associated methods relate to targeted digital correction of a predetermined component of inter-symbol interference (ISI) associated with two or more ranks of cascaded track-and-hold (T/H) front-end circuits of a Time-Interleaved analog-to-digital converter (TI-ADC). In an illustrative example, for two T/H circuit ranks of size N and M, the predetermined component to be compensated may be located at $(N \times M)^{th}$ unit interval (UI). A feed forward equalizer (FFE) and/or a decision feedback equalizer (DFE) in a digital signal processing system (DSP) may be then configured to have extra taps and corresponding expanded equalization ranges to mitigate the ISI. Thus, a deterministic ISI component at the $N \times M^{th}$ UI may be digitally corrected by providing equalization with N×M taps at low cost to facilitate scaling to higher bit rates.

20 Claims, 13 Drawing Sheets

(56) References Cited

OTHER PUBLICATIONS

Schutt-Aine, Jose E., ECE 546: Lecture-27: Equalization. University of Illinois Electrical and Computer Engineering, Spring 2020, 42 pages.
Maragos, Konstantinos, et al., A Flexible, High-Performance FPGA Implementation of a Feed-Forward Equalizer for Optical Interconnects up to 112 Gb/s. Journal of Signal Processing Systems, vol. 88, pp. 107-125, 2017, 19 pages. DOI: 10.1007/s11265-016-1201-y.
Brannon, Jesse et al., Equalization of Backplane Channels Using Transmitter FFE and Receiver CTLE+DFE. University of California at Berkeley Electrical Engineering and Computer Sciences, Technical Report No. UCB/ EECS-2018-90, Jul. 18, 2018, 51 pages.

\* cited by examiner

DSP CANCELLATION OF TRACK-AND-HOLD INDUCED ISI IN ADC-BASED SERIAL LINKS

TECHNICAL FIELD

Various embodiments relate generally to integrated circuits, and more specifically, to receivers.

BACKGROUND

Communication systems transport data from a transmitter to a receiver over a data link. Before transmission, data may be encoded in analog or digital formats. Some communication systems may modulate a carrier signal to carry the data information from the transmitter to the receiver. At the receiver, data may be recovered by demodulating the received signal.

Data links that transport data may be wired or wireless. Wired communication systems may include telephone networks, cable television, internet service provider, and fiber-optic communication nodes, for example. Wireless data links may transfer information between two or more points that are not connected by an electrical conductor. Wireless data links may transport data by using electromagnetic waves propagating through a medium, such as air or free space.

At a receiver in a digital communication system, a digitally-encoded data stream may be received as an analog signal and converted to a digital format by an analog-to-digital converter (ADC). The ADC interprets the data stream as a function of time. For example, some ADCs may be synchronized to a clock signal that determines when a voltage signal is to be sampled.

SUMMARY

Apparatus and associated methods relate to targeted digital correction of a predetermined component of inter-symbol interference (ISI) associated with cascaded track-and-hold (T/H) front-end circuits of a Time-Interleaved analog-to-digital converter (TI-ADC). In an illustrative example, for two T/H circuit ranks of size N and M, the predetermined component to be compensated may be located at $(N \times M)^{th}$ unit interval (UI). A feed forward equalizer (FFE) and/or a decision feedback equalizer (DFE) in a digital signal processing system (DSP) may be then configured to have extra taps and corresponding expanded equalization ranges to mitigate the ISI. Thus, a deterministic ISI component at the $N \times M^{th}$ UI may be digitally corrected by providing equalization with $N \times M$ taps at low cost to facilitate scaling to higher bit rates.

Various embodiments may achieve one or more advantages. For example, some embodiments using the DSP to cancel the T/H circuits' induced ISI may help relax the T/H circuits' analog requirement without substantially sacrificing overall system's performance. In some embodiments, by determining the architecture of the sampling front-end circuit (SFE) of the ADC (e.g., time-interleaved-ADC), implementation overhead of the FFE or the DFE may be advantageously reduced. Some embodiments using the DSP to cancel the T/H circuits' induced ISI may achieve a better overall power efficiency due to DSP's scalability with advanced process nodes may be advantageously achieved. Some embodiments (e.g., the digital domain implementation) may also provide flexibility, adaptability, and programmability to mitigate the T/H circuits' induced ISI. Some embodiments (e.g., the parallelized implementation of the FFE and/or DFE) may also demonstrate potential minimal cost (e.g., power consumption, area) associated with the mitigation of the T/H circuits' induced ISI. Some embodiments may advantageously facilitate adaptation for DSP (digital signal processor) solutions in which the same adaptation engine or algorithms may be applied to these extra taps as with the existing FFE and/or DFE taps. Various implementations may improve high-speed communication system that uses an ADC-based receiver in, for example, optical, networking, or communication applications.

In one exemplary aspect, an apparatus may compensate a component of intersymbol interference (ISI) which is a function of the depth and rank size of a sampling network, the apparatus comprising. The apparatus may include a time-interleaved (TI) analog-to-digital converter (ADC) system configured to receive an incoming data signal via a transmission channel and convert the incoming data signal into a digital data signal in response to a sampling clock signal. The TI-ADC system may include a sampling front-end circuit having X sampling layers, where a first sampling layer of the X sampling layers includes N track-and-hold circuits, and each ith sampling layer has Mi track-and-hold circuits coupled to a track-and-hold circuit in the (i−1)th sampling layer, $2 \leq i \leq X$. The TI-ADC system may further include N*M ADCs, M=M2*M3* . . . *Mx, where each ADC of the N*M ADCs is coupled to a corresponding track-and-hold circuit in the Xth sampling layer, an intersymbol interference (ISI) mitigation module coupled to an output of the TI-ADC system and configured to receive the digital data signal from TI-ADC system and generate a recovered signal, where the ISI mitigation module is configured to have a first predetermined number of taps such that the ISI mitigation module is operable to filter the received digital data substantially in accordance with an inverse transfer-function of the transmission channel. The ISI mitigation module may be further configured to have a second predetermined number of taps such that the ISI mitigation module has an equalization range that covers at least an (N*M)th unit interval (UI).

The ISI mitigation module of the apparatus may further include a feed forward equalizer (FFE) coupled to the output of the TI-ADC system. The apparatus may be configured such that the first predetermined number of taps is the sum of a predetermined number (J) of precursor taps and a predetermined number (K) of post-cursor taps, where the second predetermined number of taps is J+K+1+N×M+B taps. The ISI mitigation module may still further include a decision feedback equalizer (DFE), having a second predetermined number of taps, coupled to an output of the FFE. The apparatus may be further configured such that the first predetermined number of taps is the sum of a predetermined number (J) of precursor taps and a predetermined number (K) of post-cursor taps, wherein the second predetermined number of taps is (N*M−(J+K)).

The apparatus may further comprise a continuous time-linear equalizer (CTLE) configured to receive the incoming data signal and generate a first equalized signal, where the ADC system is coupled to an output of the CTLE. The ISI mitigation module of the apparatus may be configured to have a first predetermined number of taps such that the ISI mitigation module is operable to filter the received digital data substantially in accordance with an inverse transfer-function of the transmission channel, and the ISI mitigation module is configured to achieve a predetermined bit error rate (BER) or maximum eye opening of an eye diagram of the recovered signal. The apparatus may be configured such that X=3. The apparatus may be configured such that X>3. The apparatus may be configured such the first predetermined number of taps is the sum of a predetermined number (J) of precursor taps and a predetermined number (K) of post-cursor taps, where the second predetermined number of taps is (N*M−(J+K)).

In another exemplary aspect, an apparatus may compensate a component of intersymbol interference (ISI), the component being a function of the depth and rank size of a sampling network. The apparatus may include an inter-symbol interference (ISI) mitigation module adapted to operatively couple to an output of a time-interleaved (TI) analog-to-digital converter (ADC) system and to receive a digital data signal from the TI-ADC system, and, in response to the received digital signal, generate a recovered signal. The TI-ADC system may be configured to receive an incoming data signal via a transmission channel and convert the incoming data signal into the digital data signal in response to a sampling clock signal. The TI-ADC system may include a sampling front-end circuit having X sampling layers, where a first sampling layer of the X sampling layers include N track-and-hold circuits, and each ith sampling layer having Mi track-and-hold circuits coupled to a track-and-hold circuit in the (i−1)th sampling layer, 2≤i≤X. The TI-ADC system may further include N*M ADCs, M=M2*M3* . . . *Mx, where each ADC of the N*M ADCs is coupled to a corresponding track-and-hold circuit in the Xth sampling layer. The apparatus may be configured such that the ISI mitigation module is further configured to have a first predetermined number of taps such that the ISI mitigation module is operable to filter the received digital data substantially in accordance with an inverse transfer-function of the transmission channel, and where the ISI mitigation module is further configured to have a second predetermined number of taps such that the ISI mitigation module has an equalization range that covers an (N*M)th unit interval (UI).

The ISI mitigation module of the apparatus may further include a feed forward equalizer (FFE) coupled to the output of the TI-ADC system. The apparatus may be further configured such that the first predetermined number of taps is the sum of a predetermined number (J) of precursor taps and a predetermined number (K) of post-cursor taps, where the second predetermined number of taps is (N*M−(J+K)). The ISI mitigation module of the apparatus may further include a decision feedback equalizer (DFE), having a second predetermined number of taps, coupled to an output of the FFE. The apparatus may be further configured where the first predetermined number of taps is the sum of a predetermined number (J) of precursor taps and a predetermined number (K) of post-cursor taps, wherein the second predetermined number of taps is (N*M−(J+K)). The apparatus may be configured where X=2.

In another exemplary aspect, a method may compensate a component of intersymbol interference (ISI), the component being a function of the depth and rank size of a sampling network. The method may include providing a time-interleaved (TI) analog-to-digital converter (ADC) system configured to receive an incoming data signal via a transmission channel and convert the incoming data signal into a digital data signal in response to a sampling clock signal, the TI-ADC system including: providing a sampling front-end circuit having X sampling layers, wherein a first sampling layer of the X sampling layers comprises N track-and-hold circuits, and each ith sampling layer having Mi track-and-hold circuits coupled to a track-and-hold circuit in the (i−1)th sampling layer, 2≤i≤X; and, N*M ADCs, M=M2*M3* . . . *Mx, where each ADC of the N*M ADCs is coupled to a corresponding track-and-hold circuit in the Xth sampling layer; and, providing an inter-symbol interference (ISI) mitigation module coupled to an output of the TI-ADC system and configured to receive the digital data signal from TI-ADC system and generate a recovered signal, where the ISI mitigation module is configured to have a first predetermined number of taps such that the ISI mitigation module is operable to filter the received digital data substantially in accordance with an inverse transfer-function of the transmission channel, where the ISI mitigation module is further configured to have a second predetermined number of taps such that the ISI mitigation module has an equalization range that covers an (N*M)th unit interval (UI).

The ISI mitigation module of the method may further comprise a feed forward equalizer (FFE) coupled to the output of the TI-ADC system. The method may be further configured where X<4. The method may be further configured where the first predetermined number of taps is the sum of a predetermined number (J) of precursor taps and a predetermined number (K) of post-cursor taps, where the second predetermined number of taps is (N*M−(J+K)).

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

Apparatus and associated methods relate to targeted digital correction of a predetermined component of inter-symbol interference (ISI) associated with two or more ranks of cascaded track-and-hold (T/H) front-end circuits of a Time-Interleaved analog-to-digital converter (ADC). In an illustrative example, for an ADC having two T/H circuit ranks of size N and M, the predetermined component to be compensated may be located at $(N \times M)^{th}$ unit interval (UI). A feed forward equalizer (FFE) and/or a decision feedback equalizer (DFE) in a digital signal processing system (DSP) may be then configured to have extra taps and corresponding expanded equalization ranges to mitigate the ISI. Thus, better overall power efficiency due to DSP's scalability with advanced process nodes may be advantageously achieved.

To aid understanding, this document is organized as follows. First, an exemplary platform (e.g., a field programmable gate array FPGA) suitable to perform data communication is briefly introduced with reference to FIG. 1. Second, with reference to FIGS. 2-5, the discussion turns to exemplary embodiments that illustrate schematics of a TI-ADC and an DSP in a receiver, and exemplary simulation results that shows inter-symbol interference introduced by the TI-ADC. Then, with reference to FIGS. 6A-9B, exemplary architectures of FFE and DFE in the DSP and exemplary methods to configure the DSP and FFE are shown. Finally, with reference to FIG. 10, another exemplary platform (e.g., a system-on-Chip (SOC)) suitable to perform data communication and DSP is briefly introduced.

Figure 1:
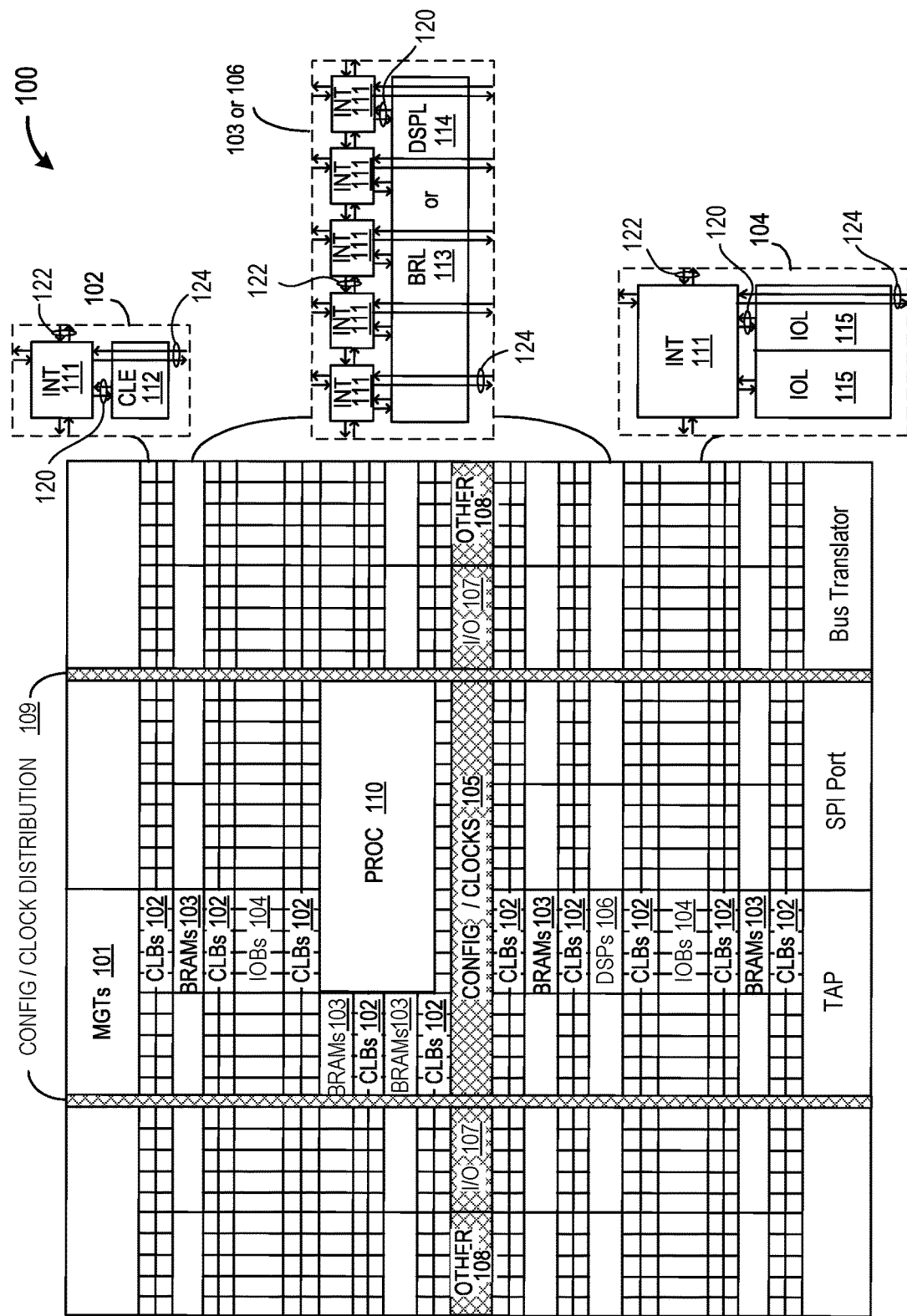
FIG. 1 depicts an exemplary programmable integrated circuit (IC) on which the disclosed circuits and processes may be implemented.

FIG. 1 depicts an exemplary programmable integrated circuit (IC) on which the disclosed circuits and processes may be implemented. A programmable IC 100 includes FPGA logic. The programmable IC 100 may be implemented with various programmable resources and may be referred to as a System on Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An IOB 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

Integrated circuits (IC) (e.g., FPGA)), such as the programmable IC 100, for example, may be used in a communication system to support various data communication protocols over wide frequency ranges while using progressively smaller areas. In various examples, analog signal levels may be converted into digital voltages, digital currents or digital charge signals using an analog-to-digital converter (ADC). Inter-symbol interference (ISI) is a form of distortion of a signal in which one symbol interferes with prior and/or subsequent symbols. When the ADC is implemented in a receiver and includes a time-interleaved (TI)-ADC, ISI may be introduced due to, for example, finite bandwidth, and/or or non-optimal frequency response of analog circuitry (e.g., track-and-hold circuits) inside a sampling front-end (SFE) circuit of the time-interleaved ADC. The presence of ISI may introduce errors at the receiver's output. Thus, the architecture of the ADC-based receiver may be further improved to minimize the effects of ISI, and thereby deliver the digital data to its destination with a reduced error rate.

Figure 2:
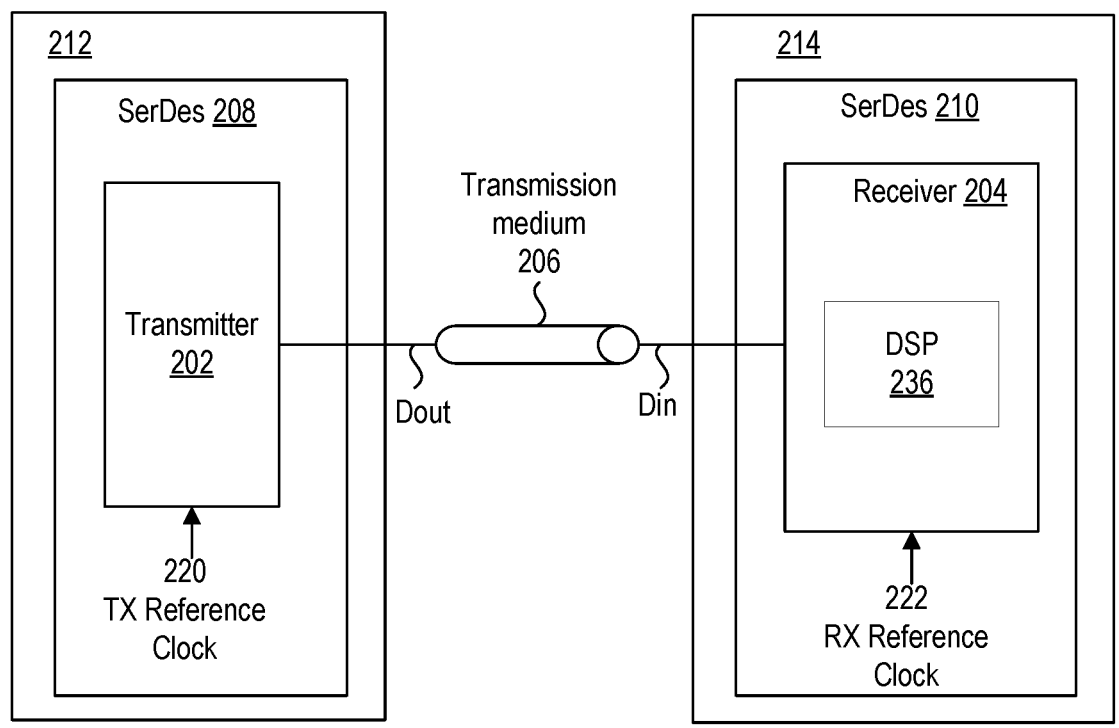
FIG. 2 depicts an exemplary receiver having an exemplary digital signal processing system (DSP) implemented in an exemplary communication system.

FIG. 2 depicts an exemplary receiver having an exemplary digital signal processing system (DSP) implemented in an exemplary communication system. In this depicted example, an exemplary communication system 200 includes a transmitter 202 configured to transmit data $D_{out}$ to a receiver 204 over transmission medium 206. In some embodiments, the receiver 204 may be an ADC-based receiver. The receiver 204 may advantageously minimize the effects of inter-symbol interference ISI, and thereby deliver the digital data to its destination with a reduced error rate by providing a digital signal processing system (DSP) 236 having a feed forward equalizer (FFE) and/or a decision feedback equalizer (DFE) with taps with predetermined locations to mitigate ISI introduced by, for example, a sampling front-end circuit of the ADC.

The transmission medium 206 may degrade the signal quality of the transmitted signal $D_{out}$. The data signal received by the receiver 204 may be defined as $D_{in}$. The received data $D_{in}$ may require reconstruction (equalization) before use.

The transmitter 202 may be part of a serializer-deserializer (SerDes) 208. The receiver 204 may also be part of a SerDes 210. The transmission medium 206 may include printed circuit board (PCB) traces, vias, cables, connectors, decoupling capacitors, and the like. In some embodiments, the SerDes 208 may be disposed in an integrated circuit (IC) 212, and the SerDes 210 may be disposed in an IC 214.

The transmitter 202 drives serial data onto the transmission medium 206 using, for example, a digital baseband modulation technique. In general, the serial data is divided into symbols. The transmitter 202 converts each symbol into an analog voltage mapped to the symbol. The transmitter 202 couples the analog voltage generated from each symbol to the transmission medium 206. In some embodiments, the transmitter 202 may use a binary non-return-to-zero (NRZ) modulation scheme. In binary NRZ, a symbol may be one bit of the serial data and two analog voltages may be used to represent each bit. In some examples, the transmitter 202 may use multi-level digital baseband modulation techniques, such as pulse amplitude modulation (PAM), where a symbol includes two or more bits of the serial data and more than two analog voltages may be used to represent each bit.

The receiver 204 may include a digital signal processing system (DSP) 236 operable to equalize the digital signal to compensate for, for example, post-cursor inter-symbol interference (ISI). An exemplary architecture of the DSP 236 is discussed in further detail with reference to FIG. 3 and FIG. 5.

As illustrated in FIG. 2, the transmitter 202 may use a transmitter (TX) reference clock signal 220, and the receiver 204 may use a receiver (RX) reference clock signal 222. In some embodiments, there may be a difference between the TX reference clock signal 220 and the RX reference clock signal 222, which may be referred to as a frequency offset between the transmitter reference clock and the receiver reference clock signal 222. A frequency reference offset may exist when the TX reference clock signal 220 and the RX reference clock signal 222 use independent clock sources (e.g., clock sources that are nominally but not exactly identical in frequency). In some embodiments, the frequency offset may be fixed (e.g., equal to a constant). In some embodiments, the frequency offset may not be fixed, for example, may be a periodic function of time.

Figure 3:
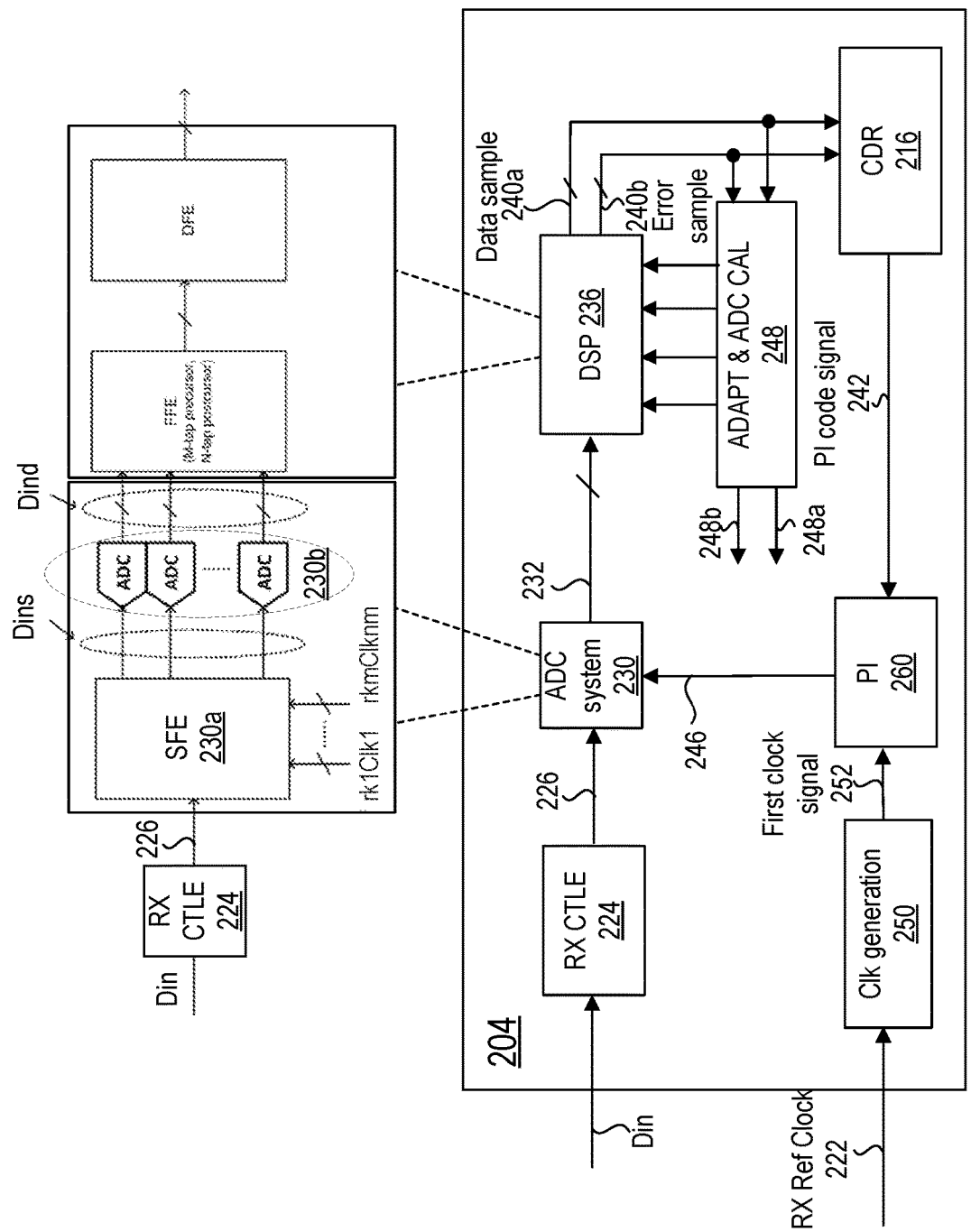
FIG. 3 depicts a block diagram of an exemplary receiver, and an exemplary time-interleaved analog-to-digital converter (TI-ADC) implemented in the exemplary receiver.

FIG. 3 depicts a block diagram of an exemplary receiver, and an exemplary analog-to-digital converter (ADC) implemented in the exemplary receiver. In this depicted example, the receiver 204 includes a continuous time linear equalizer (CTLE) 224 configured to receive the analog signal $D_{in}$ from the transmission medium 206. The CTLE 224 may operate as a high-pass filter or band-pass filter to compensate for the low-pass characteristics of the transmission medium 206. The peak and magnitude of the frequency response of the CTLE 224 may be adjusted by an adaptation and calibration circuit 248.

The CTLE 224 outputs a first equalized analog signal 226. The first equalized analog signal 226 is then received by an analog-to-digital converter (ADC) system 230. The ADC system 230 may sample and convert the first equalized analog signal 226 into a digital signal $D_{ind}$. The sampling and conversion may be controlled by one or more clock signals. In this depicted example, the ADC system 230 includes time-interleaved ADC. For example, the time-interleaved ADC 230 includes a sampling front-end circuit (SFE) 230a coupled to an output of the CTLE 224 and configured to sample the first equalized analog signal 226 in response to a number of sampling clock signal (e.g., $1^{st}$ rank clock signal, . . . last rank clock signal) to generate a sampled signal $D_{ins}$. The time-interleaved ADC 230 includes a number of ADC slices 230b coupled to the SFE to receive the sampled signal $D_{ins}$ and generate the digital signal $D_{ind}$. An exemplary architecture of the time-interleaved ADC 230 is discussed in further detail with reference to FIG. 4.

The receiver 204 also includes a digital signal processing system (DSP) 236 coupled to the output of the ADC 230 to receive the digital signal 232. In some embodiments, the DSP 236 may be configured to perform equalization operations on the digital signal 232, which operations may include a feed forward equalizer (FFE) and/or a decision feedback equalizer (DFE). An exemplary architecture of the DSP 236 is discussed in further detail with reference to FIG. 5. The DSP 236 may be operable to equalize the digital signal 232 to compensate for, for example, post-cursor inter-symbol interference (ISI).

Track-and-hold (T/H) circuits in the sampling front-end circuit 230a of the ADC-based serial links may suffer from limited bandwidth as, for example, data rate keeps rising, power consumptions constraints increase, or some combination thereof, which may cause self-induced ISI at time delays given by the interleave factor of the ADC system 230. The transfer function of each rank's T/H circuits may impact the ADC system's overall 230 sampled pulse response at known cursor locations. The architecture of the sampling front-end circuit 230a will be discussed in further detail with reference to FIG. 4A. To mitigate the ISI introduced by the sampling front-end circuit 230a in the digital domain, the DSP 236 is further configured to have a different equalization range to target specific cursor locations by adjusting the number of taps of the FFE and/or DFE, for example. Thus, better overall power efficiency due to DSP's scalability with advanced process nodes may be advantageously achieved.

In some embodiments, the DPS circuit 236 may include slicers configured to sample the digital signal 232 to generate a data sample 240a and an error sample 240b per symbol k. In some embodiments, the slicers may include separate data slicers and error slicers. In some embodiments, the slicers may include, for example, four error slicers. In some embodiments, each of the slicers may sample its input signal using a sampling clock at the baud-rate (symbol rate) to generate the data and error samples. The data samples 240a may include estimated values for the symbols, and the error samples 240b may include estimated decision errors for the symbols. Each data sample 240a and each error sample 240b may include one or more bits depending on the type of modulation scheme employed (e.g., one-bit samples for binary NRZ and multi-bit samples for PAM).

In this depicted example, the receiver 204 also includes a clock and data recovery (CDR) circuit 216 coupled to the outputs of the DSP 236 to receive the data samples 240a and error samples 240b. In some embodiments, the CDR circuit 216 may employ the baud-rate phase detection CDR architecture. The CDR circuit 216 generates a phase interpolator (PI) code signal 242 in response to the received data samples 240a and error samples 240b.

In this depicted example, the receiver 204 also includes a clock generation circuit 250 configured to receive the RX reference clock signal 222 and generate a first clock signal 252. In this depicted example, the clock generation circuit 250 configured to receive the RX reference clock signal 222 to generates the first clock signal 252. In some embodiments, the clock generation circuit 250 may include a phase-locked loop (PLL) (not shown).

In this depicted example, the receiver 204 also includes a phase interpolator (PI) 260. The PI 260 receives the first clock signal 252 from the clock generation circuit 250. The PI 260 may shift the phase of the first clock signal 252 based on the PI code signal 242 output by the CDR circuit 216. The PI 260 may output the phase-shifted clock signal as a sampling clock signal 246 used to generate appropriate clock signals for ADC 230, for example. In some embodiments, the phase interpolator 260 may produce fine, evenly spaced sampling phases to allow the CDR circuit 216 to have fine phase control. The CDR circuit 216 may track the incoming data signal $D_{in}$ that can have a frequency offset from the local PLL reference clock (e.g., the RX reference clock 222). In some embodiments, the CDR circuit 216 may include a phase detector configured to receive the data samples 240a and error samples 240b to generate the PI code signal 242. In some embodiments, the PI 260 may be replaced by, for example, a phase interpolator and an in-phase and quadrature phase generator. In some embodiments, an intermediate clock generator (ADC clkgen, not shown) may be connected between PI 260 and ADC 230. In such embodiments, PI 260 may output a single phase signal or a pair of complementary phases (e.g., 0 degrees and 180 degrees) to the ADC clkgen. The ADC clkgen may then generate appropriate phases and corresponding clock signals for the various SFE ranks.

The data samples 240a and error samples 240b are also received by the adaptation and calibration circuit 248. In some embodiments, the adaptation and calibration circuit 248 may generate control signals 248a for the CTLE 224 and control signals 248b for the calibration of the ADC 230. In some embodiments, the adaptation and calibration circuit 248 may also generate an adaptation control code to adapt the decision circuits (e.g., DFE, FFE) in the DSP 236, using known adaptation algorithms.

In some embodiments, the receiver 204 may also include an automatic gain control (AGC) circuit (not shown). An output of the CTLE 224 may be coupled to an input of the AGC circuit. The AGC circuit may be used to control the gain of the high-pass filter. The gain of the AGC circuit may be also controlled by the adaptation circuit 242. In some embodiments, the AGC circuit may precede the CTLE circuit 224. In other examples, the receiver 204 may include other types of continuous-time filters with or without amplification. In some embodiments, the receiver 204 may also include a deserializer (not shown) to group data samples 240a and error samples 240b to generate a deserialized signal to be processed by the CDR circuit 216.

Figure 4A:
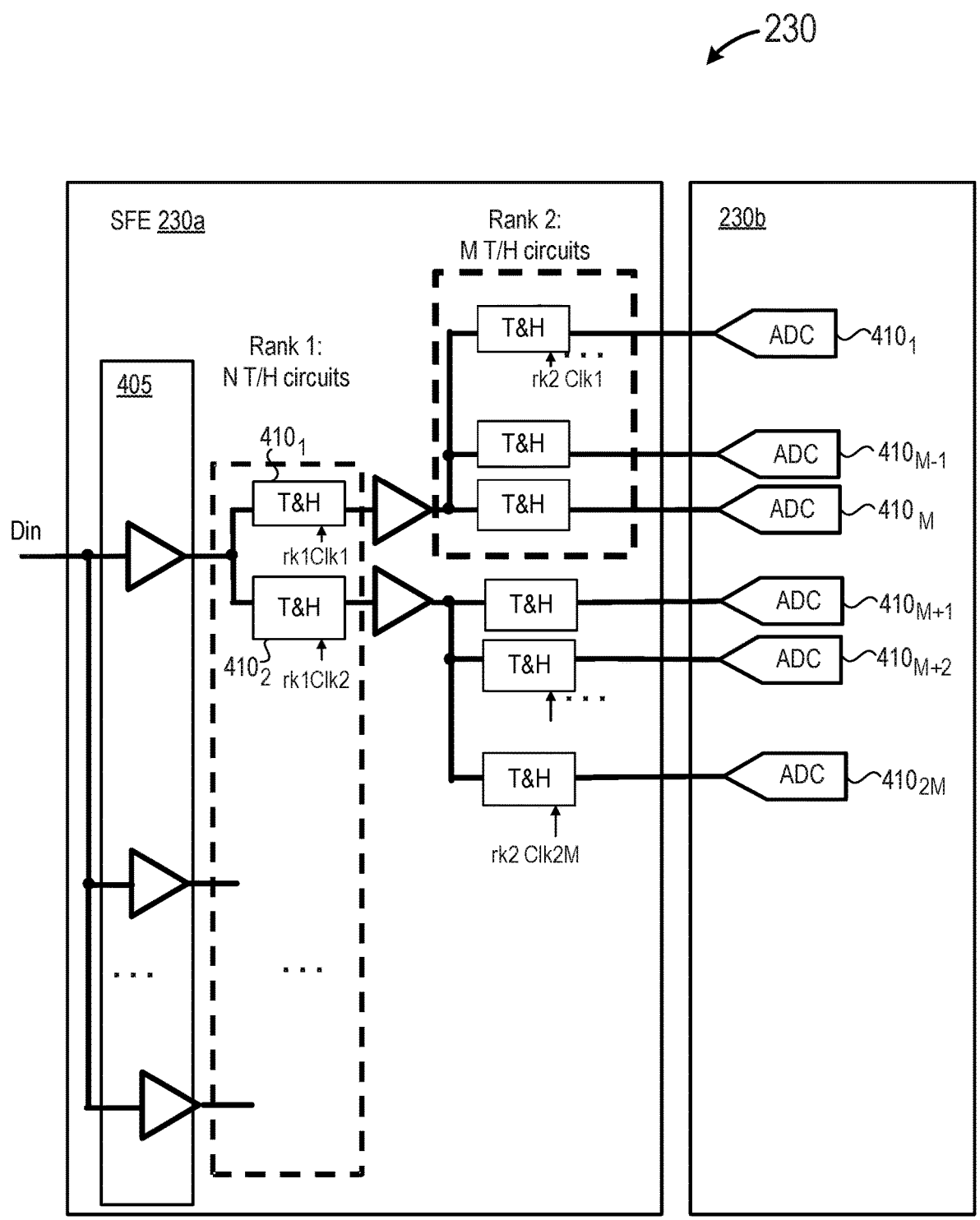
FIG. 4A depicts an exemplary sampling front-end circuit implemented in a time-interleaved ADC.

FIG. 4A depicts an exemplary sampling front-end circuit implemented in a time-interleaved ADC. The time interleaving may be performed through a succession of multiple hierarchical layers arranged as a tree structure, where endpoints on each one of the final branches may be a number of ADCs.

Various embodiments may include a sampling front-end circuit having 2, 3, 4 or more ranks. In this depicted example, the ADC system 230 includes a two-layer sampling front-end circuit (SFE) 230a. A first sampling layer of circuits (e.g., Rank 1) of the SFE 230a includes, for example, a number of (e.g., N/2) voltage buffers 405 configured to receive the first equalized analog signal 226. Rank 1 also includes, for example, N track-and-hold (T/H) circuits (e.g., $410_1, 410_2, \ldots 410_N$) coupled to the number of voltage buffers 405. In some embodiments, each T/H circuit in Rank 1 may include a switch controlled by a corresponding clock signal rk1clki, i=1~N. In some embodiments, the T/H circuits in Rank 1 may also include a number of capacitors (not shown). One terminal of each capacitor may be connected to a corresponding switch, the other terminal of each capacitor may be connected to a finite impedance voltage source. In some embodiments, the SFE 230 may also include N buffers coupled to the output of the N T/H circuits (e.g., $410_1, 410_2, \ldots 410_N$) in Rank 1, respectively.

A second sampling layer of circuits Rank 2 of the sampling front-end circuit 230a includes, for example, M T/H circuits coupled to a corresponding T/H circuit in Rank 1 or a corresponding buffer of the N buffers. In some embodiments, each T/H circuit in Rank 2 may include a switch controlled by a corresponding clock signal rk2clkj, j=1~(N*M). In some embodiments, the T/H circuits in Rank 2 may also include a number of capacitors (not shown).

In this depicted example, the TI-ADC 230 also includes N*M ADCs connected to the N*M T/H circuits in the SFE 230a. By determining the architecture of the sampling front-end circuit (SFE) of the ADC (e.g., time-interleaved-ADC), specific locations of ISI introduced by the SFE may be determined. For example, for the N*M sampling front-end circuit 230a, ISI introduced by this SFE 230a may appear at the $N^{th}$ unit interval (UI) and the $(N*M)^{th}$ UI. For an N*M*L sampling front-end circuit, ISI introduced by this N*M*L SFE may appear at the $N^{th}$ UI and the $(N*M*L)^{th}$ UI. Thus, the taps of the DFE and/or FFE may be then selected (such that the equalization range may be selected) to minimize or cover the ISI introduced by the SFE at corresponding unit intervals (UI).

Figure 4B:
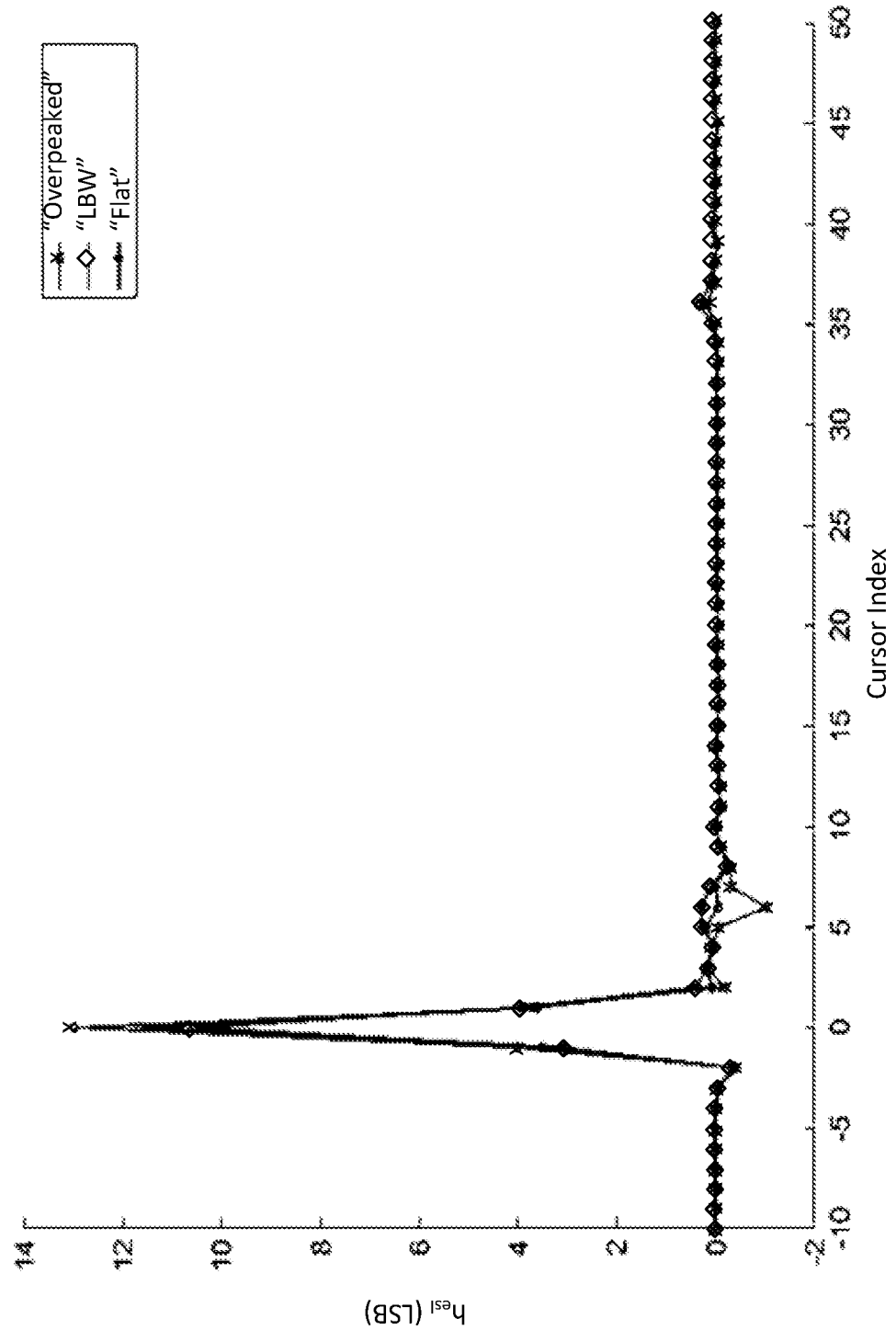
FIG. 4B depicts exemplary measurement results that shows inter-symbol interference introduced by the sampling front-end circuit at different unit intervals (UIs).

FIG. 4B depicts exemplary simulation results that shows inter-symbol interference introduced by the sampling front-end circuit at different unit intervals (UIs). In this depicted example, the second rank (Rank2) T/H frequency response impact on sampled pulse response is simulated based on a 6*6 SFE architecture.

As shown in FIG. 4B, the T/H circuits' frequency response directly affects the overall link's sampled pulse response. Given an N*M interleave architecture, the Rank2 buffer transfer function will affect ISI at the $N^{th}$ UI and the $(N*M)^{th}$ UI. In this simulation results, the Rank2 buffer transfer function affects the $6^{th}$ UI and the $36^{th}$ UI.

Figure 5:
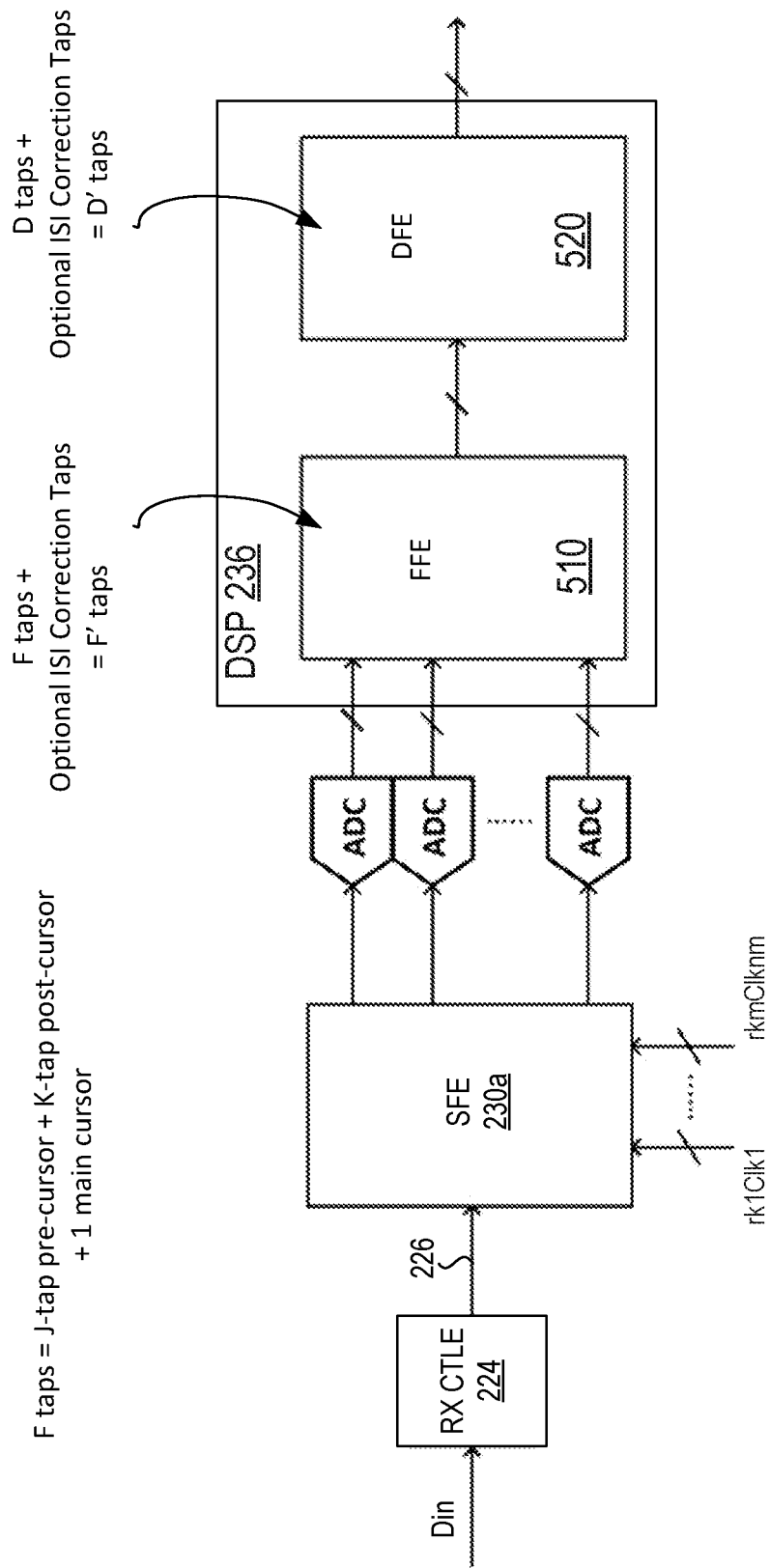
FIG. 5 depicts a block diagram of an exemplary DSP implemented in the exemplary receiver.
Figure 6A:
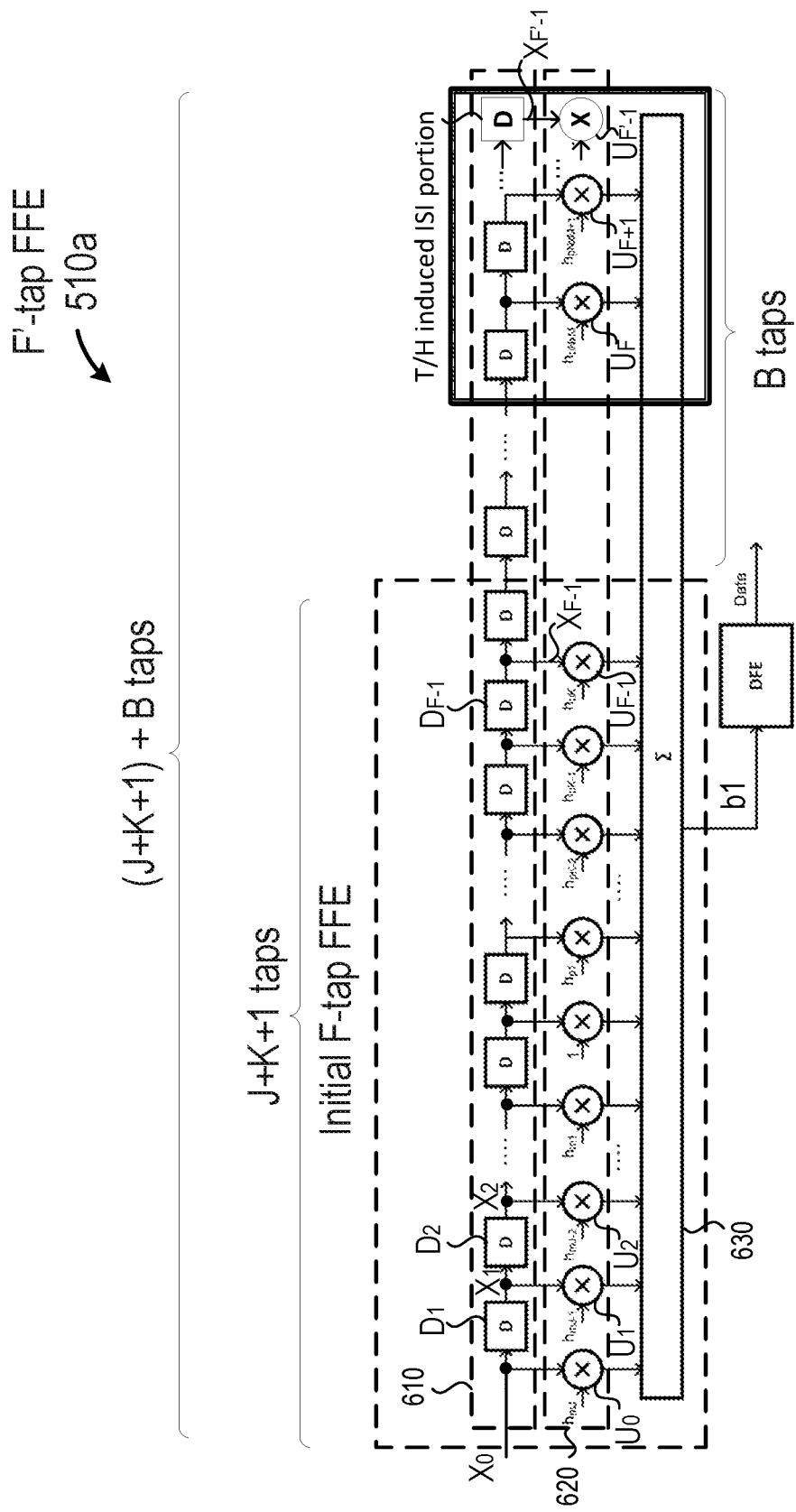
FIG. 6A depicts a first exemplary architecture of an exemplary feed forward equalizer (FFE) in the DSP.

FIG. 5 depicts a block diagram of an exemplary DSP system implemented in the exemplary receiver. In this depicted example, the DSP 236 includes a feed forward equalizer (FFE) 510 coupled to the ADC system 230 and a decision feedback equalizer 520 coupled to an output of the FFE 510. With reference to FIG. 6A, the FFE 510 may be initially designed to have a predetermined number (e.g., number F) of taps such that the FFE 510 may function as a filter (e.g., a finite impulse response) with an inverse transfer-function to that of the transmission medium 206, wherein the equalization provided by the F taps may yield a recovered signal that meets a predetermined signal quality criteria (e.g., eye diagram specification, bit error rate specification). The F taps FFE may have a corresponding equalization range R1.

The DFE 520 may be initially designed to have a predetermined number (e.g., number D) of taps to, for example, achieve a predetermined bit error rate (BER) and/or maximum eye opening of an eye diagram of a recovered/equalized signal. The initial D number of taps in the DFE 520 may be, for example, predetermined from system simulations based on many different channels to determine how many taps are needed to achieve a desired BER performance at a reasonable implementation cost. The D taps DFE may have a corresponding equalization range R2. The adjustment of the tap weights of the FFE and DFE may be performed either manually or automatically by an appropriate adaptive algorithm.

As discussed with reference to FIG. 4A and FIG. 4B, the SFE 230a may induce ISI at specific locations. To mitigate the ISI, either the FFE 510 or the DFE 520 may be configured to have a different number of taps to change the corresponding equalization range to target the specific locations. For example, the initial F taps FFE (where F=J (#pre-cursor taps)+K (#post-cursor taps)+1 (main cursor tap)) may be augmented to have F' taps (where F'=(M×N)−(J+K)) and that may realize a corresponding equalization range R1'. The initial D taps DFE may be augmented to have D' taps and have a corresponding equalization range R2'. Either adding taps to provide a M×Nth tap in the FFE 510 or DFE 520 may be employed to substantially reduce or eliminate the induced ISI that is conventionally outside of the existing coverage range. By exploiting knowledge of where to expect the ISI location at the M×Nth UI, ISI improvement may be achieved digitally with a low implementation cost in the FFE 510 or the DFE 520. In some embodiments, more taps may be added to the initial FFE 510. By configuring the initial FFE and/or DFE with updated taps, the induced ISI may be mitigated to a negligible level without incurring substantial excessive power and area penalty.

FIG. 6A depicts a first exemplary architecture of an exemplary feed forward equalizer (FFE) in the DSP. In this depicted example, an F'-tap FFE 510a in a fully serial processing form is shown, where F'=F+B, F taps are used to enable the FFE 510a to function as a finite impulse filter, and the B taps are the newly added number of taps to expand the F-tap FFE's equalization cover range to cover the ISI induced at the $(N*M)^{th}$ UI.

The FFE 510a includes a delay circuit 610, a multiplication circuit 620 having two or more multipliers ($U_0$, $U_1$, ..., $U_{F-1}$ ..., $U_{F'-1}$), and a summer circuit 630. The delay circuit 610 includes two or more delay cells ($D_1$, $D_2$, ..., $D_{F-1}$ ..., $D_{F'-1}$). An incoming data stream $X_0$ is input to the delay circuitry 610. The incoming data stream signal $X_0$ may be at full baud rate of the signal $D_{inb}$. The delay cells ($D_1, D_2, ..., D_{F-1} ..., D_{F'-1}$) generate respective delayed versions ($X_1, X_2, ..., X_{F-1} ..., X_{F'-1}$) of the input signal $X_0$. The signals ($X_0, X_1, X_2, ..., X_{F-1} ..., X_{F'-1}$) are input to respective multipliers ($U_0, U_1, ..., U_{F-1} ..., U_{F'-1}$), where they are multiplied (weighted) with respective FFE weighting coefficients ($h_{mJ}, h_{mJ-1}, ..., 1, h_{p1}, ..., h_{pK}, ... h_{pN*M}, h_{pN*M+1}, ..., h_{pN*M+a}$). The outputs of the multipliers ($U_0, U_1, ..., U_{F-1} ..., U_{F'-1}$) are summed in the summer circuitry 630 to generate an equalized signal y1.

In this depicted example, J precursor taps and K postcursor taps are shown in the figure for the F-tap FFE coverage range. The added FFE taps (e.g., B taps, where A B), starting at the $(N*M)^{th}$ postcursor location, may be used to mitigate the T/H circuits induced ISI. Several delay cells (e.g., A-B) of may be used between the K postcursor location and the $(N*M)^{th}$ postcursor location, but no active coefficient is assigned to those delay cells.

Due to the nature of FFE, several more trailing taps may be used to fully cancel the T/H circuits induced ISI. For example, B taps are used to fully cancel the T/H circuits induced ISI, B≥2. In some embodiments, one tap at the $(N*M)^{th}$ location may be sufficient if the receiver's performance is within a predetermined margin. In some embodiments, B taps may include more than one section of extra taps. The number of B tap sections may depend on the SFE interleave structure such as, for example, the number of ranks therein and the UIs which will experience T/H induced ISI which may be outside of a normal FFE correction range. In some embodiments, the delay circuit 610 may be implemented using delay circuitry that generates multiple time-delayed versions of the input signal $X_0$ available simultaneously. In some embodiments, the delay lines may include shift registers that delay the incident data signal by a precise amount without introducing any distortions to the input signal $X_0$.

Figure 6B:
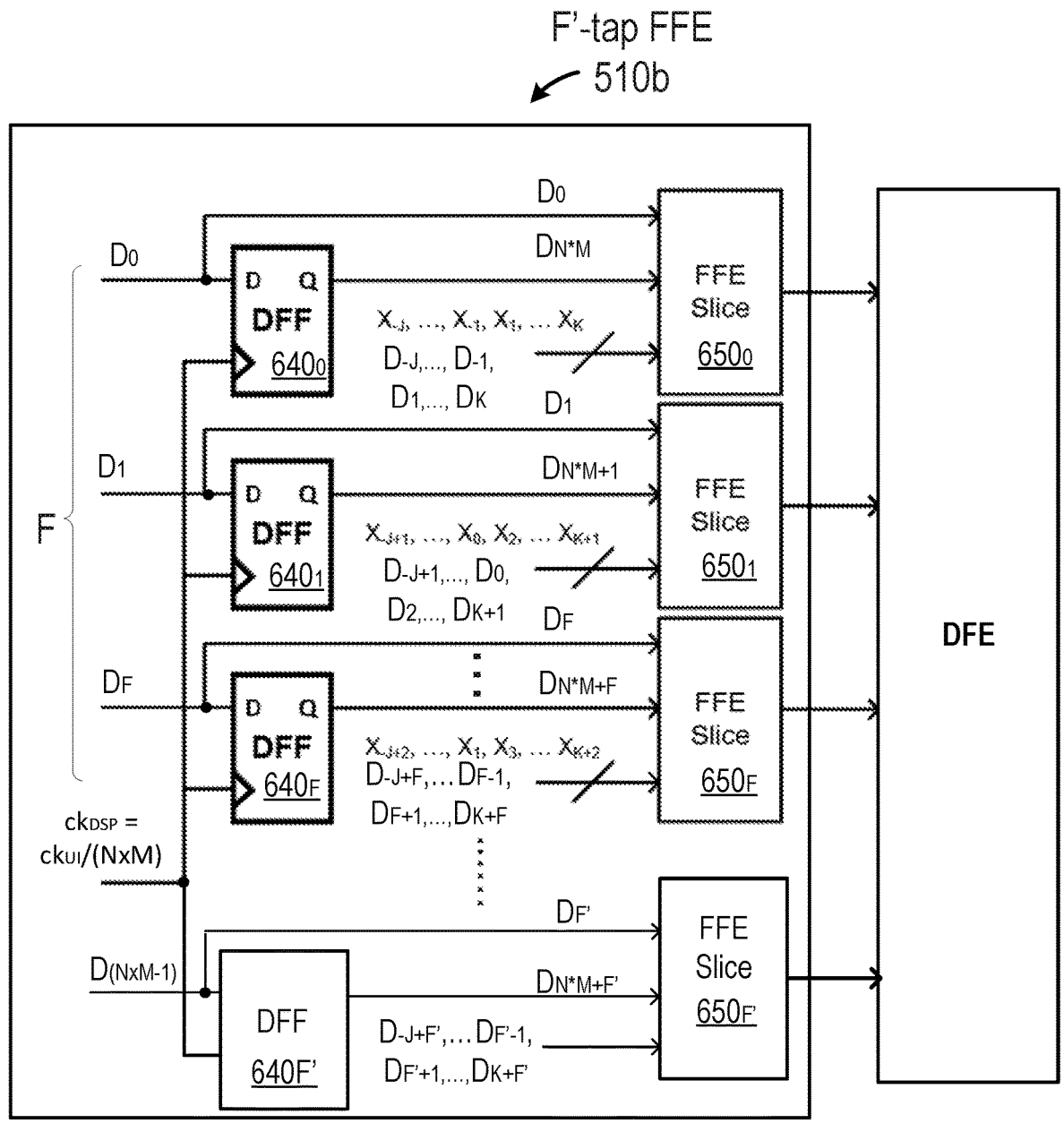
FIG. 6B depicts a second exemplary architecture of an exemplary feed forward equalizer (FFE) in the DSP.

FIG. 6B depicts a second exemplary architecture of an exemplary feed forward equalizer (FFE) in the DSP. In some embodiments, the data received by the DSP may be already retimed and deserialized, thus an FFE may be able to process data in a parallelized fashion. In this depicted example, the DSP is configured to work in a sub-sampled clock domain, and the sub-sampling rate $CK_{DSP}$ is 1/(N*M) of the data baud rate $CK_{UI}$. Therefore, one DSP clock delay can advantageously generate desired (N*M) UI delays for the FFE tap at the T/H circuits induced ISI location.

In this depicted example, a number of flip-flops (e.g., D-type flip flops) are used to receive each incoming data sample to create the correct delayed sample for the $(N*M)^{th}$ FFE tap.

In various embodiments, the FFE may provide, in a parallel implementation, a multiply and add structure in which each slice will output data every N×M UI, where N×M is a function of the parallelization factor.

Since the incoming data are from the retimed interleaved ADC slices, most of the data may be readily available. For example, for 650(0), the D1, D2 . . . Dk will come from the other ADC slices. With reference to FIGS. 6A-6B, there are a total of N×M ADC inputs, i.e. D0, D1 . . . D(N×M−1). The single DFF layer (640(0), 640(1) . . . ) effectively takes care of this delay. The F, F' and B are all part of the FFE slice, and account for the number of multipliers and additions performed inside an FFE slice. Some delay elements are needed but shown in the figure for simplicity. One of ordinary skill in the art may appreciate that, for later FFE slices, the precursors could be readily available from the output of an adjacent or preceding ADC slice.

Thus, by configuring the FFE to have a parallelized processing fashion, less delay cells may be used such that the induced ISI may be mitigated to a negligible level without incurring substantial additional power and area penalty.

Figure 7:
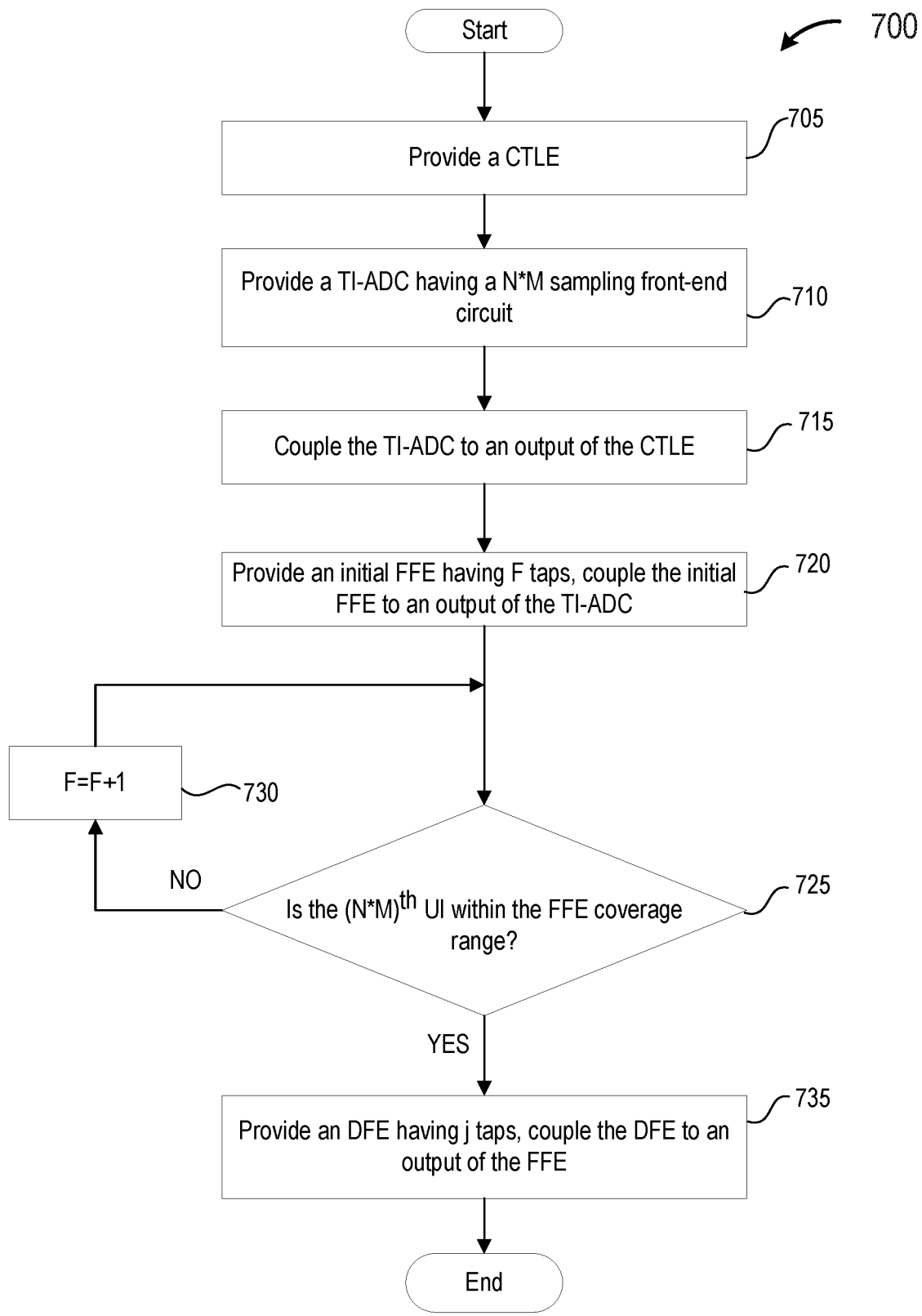
FIG. 7 depicts a flow chart of an exemplary method of configuring the DSP.

FIG. 7 depicts a flow chart of an exemplary method of configuring the DSP. In this depicted example, an exemplary method 700 of configuring the DSP 236 is discussed. The method 700 includes, at 705, providing a CTLE (e.g., the CTLE 224). The method 700 also includes, at 710, providing a time-interleaved ADC (e.g., the TI-ADC 230) having a N*M sampling front-end circuit (e.g., the SFE 230a). The method 700 also includes, at 715, coupling the TI-ADC 230 to an output of the CTLE 224.

The method 700 also includes, at 720, providing an initial FFE (e.g., the FFE 510) having a number of F taps, and coupling the FFE to an output of the TI-ADC 230. The initial FFE is configured to have F taps such that the FFE may function as a finite impulse response (FIR).

The method 700 also includes, at 725, determining whether the $(N*M)^{th}$ UI is within the FFE coverage range. If the $(N*M)^{th}$ UI is not within the FFE coverage range, then, at 730, incrementing the tap numbers F and the method loops back to 725. The method 700 also includes, at 735, providing an DFE having j taps and coupling the DFE to an output of the FFE, the FFE has an updated number of taps and accordingly an updated equalization cover range. In some embodiments, the FFE may still have the F taps, and the DFE may be updated to have extra taps (e.g., one more tap) with an updated equalization cover range to cover the $(N*M)^{th}$ UI. Thus, by configuring the FFE and/or DFE with a greater number of taps, the induced ISI may be mitigated to a negligible level without incurring substantial excessive power and area penalty.

Figure 8:
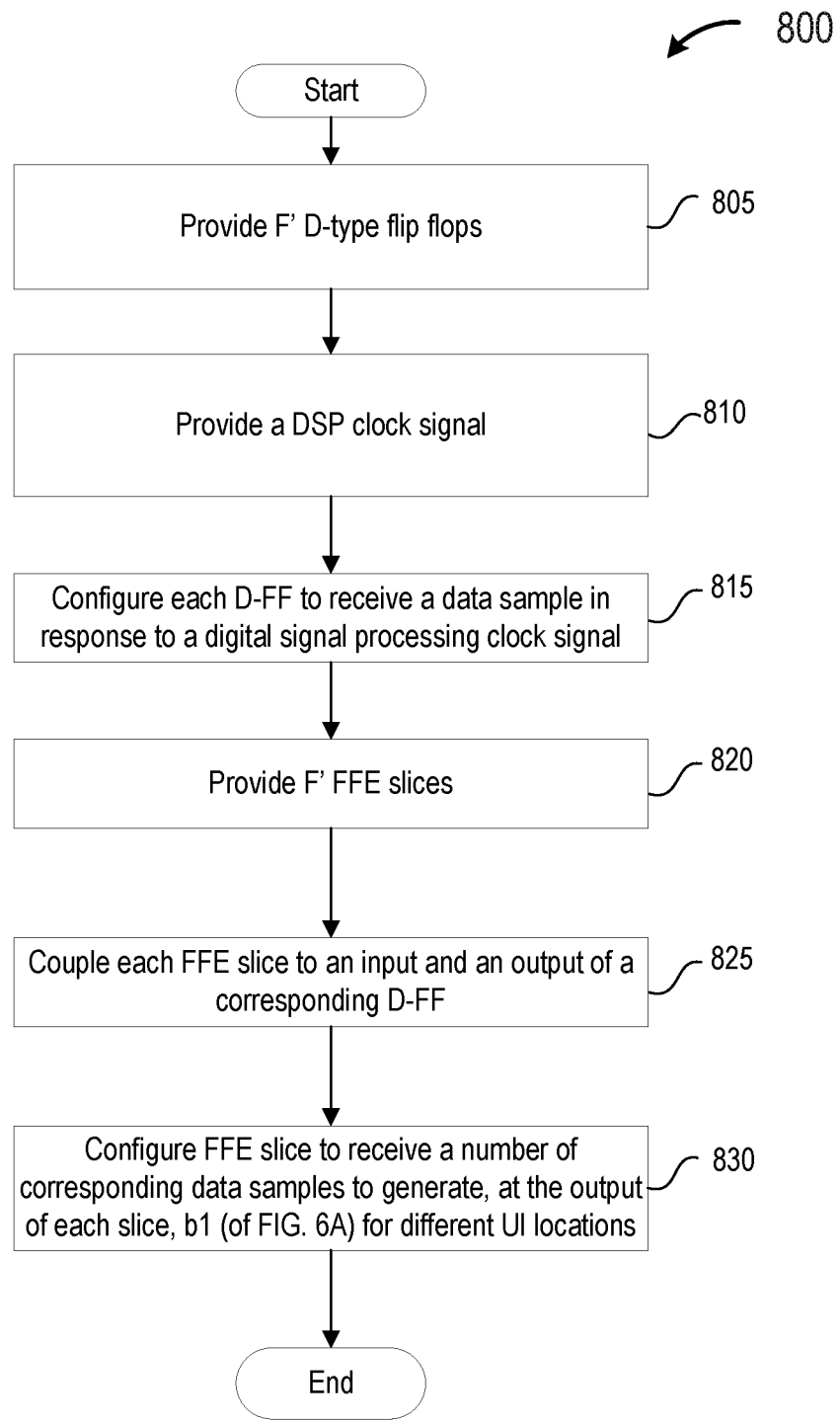
FIG. 8 depicts a flow chart of an exemplary method of configuring the FFE with reference to FIG. 6B.

FIG. 8 depicts a flow chart of an exemplary method of configuring the FFE with reference to FIG. 6B. In this depicted example, an exemplary method 800 of configuring the FFE 510b is discussed. The method 800 includes, at 805, providing a number of F' flip flops (e.g., the D-FF $640_0, \ldots, 640_{F'}$).

The method 800 also includes, at 810, providing a digital signal processing clock signal (e.g., $CK_{DSP}$) and, at 815, configuring each flip flop to receive a corresponding data sample (e.g., $D_0, \ldots, D_{F'}$) in response to the digital signal processing clock signal $CK_{DSP}$. The method 800 also includes, at 820, providing a number of F'FFE slices (e.g., the FFE slice $650_0, \ldots, 650_{F'}$), and at 825, coupling each FFE slice to an input and an output of each flip flop. The method 800 also includes, at 830, Configure FFE slice to receive a number of corresponding data samples to generate, at the output of each slice, b1 (of FIG. 6A) for different UI locations.

By way of example, and not limitation, the output of the FFE slices may be the b1 values depicted with reference to FIG. 6A, except each slice may output b1 for different UI locations. For example, 650(0) will output b1[0], b1[N×M], b1[2×N×M] . . . 650(1) will output b1[1], b1[N×M+1], b1[2×N×M+1], and so on. There will be a total of N×M FFE slices. The 650(N×M) FFE slice will output b1[N×M−1], b1[2×N×M−1] and so on. Accordingly, at each ckdsp edge, there will be generated a total of N×M b1 outputs from the N×M FFE slices, e.g., b1[0:N×M−1] at time 0, and then b1[N×M:2×N×M−1] at time 1, and so on.

Thus, by configuring the FFE to have a parallelized processing fashion, less delay cells may be used such that the induced ISI may be mitigated to a negligible level without incurring substantial excessive power and area penalty.

Figure 9A:
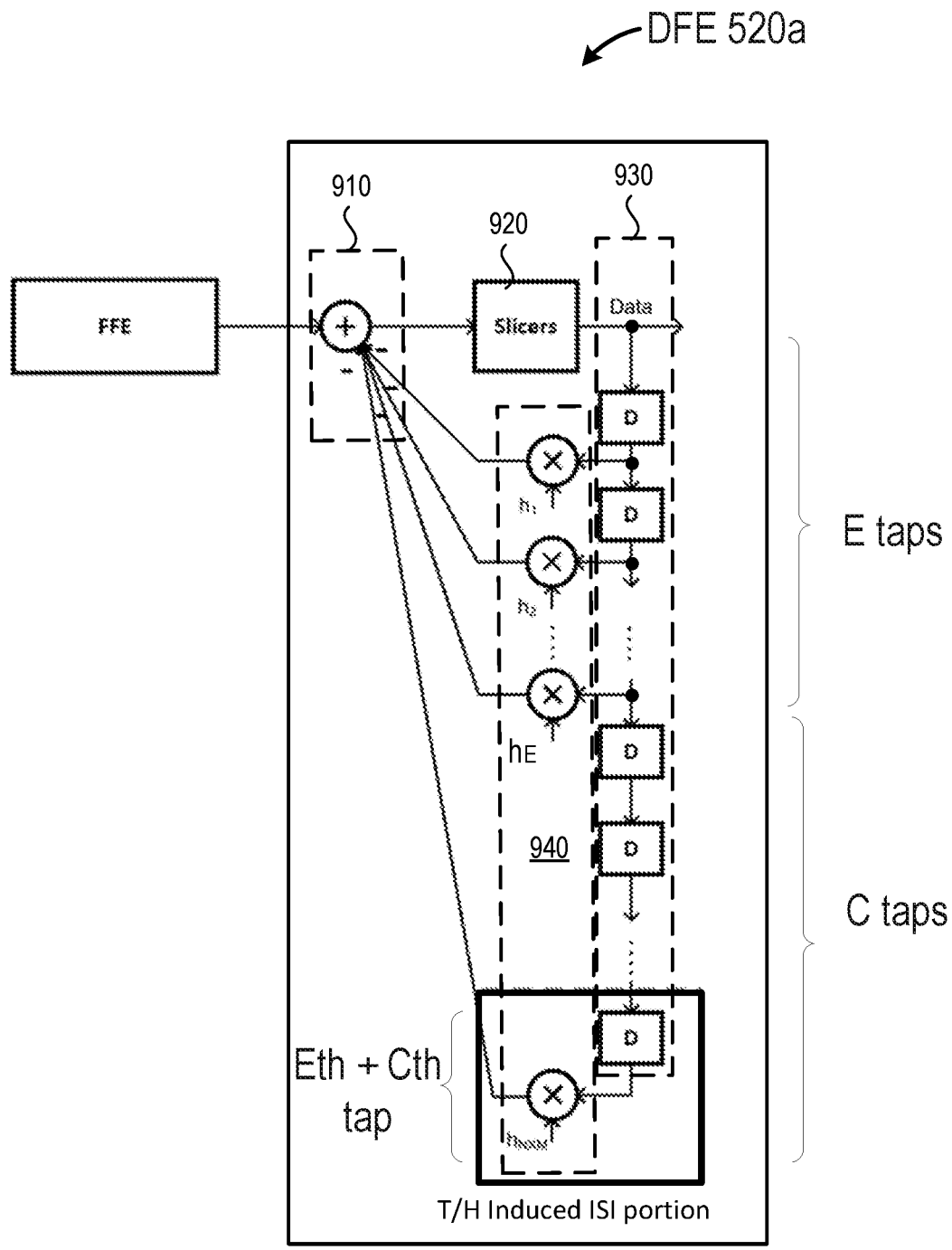
FIG. 9A depicts a first exemplary architecture of an exemplary decision feedback equalizer (DFE) in the DSP.

FIG. 9A depicts a first exemplary architecture of an exemplary decision feedback equalizer (DFE) in the DSP. DFE may achieve similar cancellation of the ISI at the $(N*M)^{th}$ location by adding an extra tap at the $(N*M)^{th}$ location in a generalized E-tap DFE. In this depicted example, the DFE 520a includes a summer circuit 910, a slicer circuit 920 having one or more slicers, a delay circuit 930, and a multiplication circuit 940. The FFE 510 processes the samples and sends the digital data stream to the slicer circuit 920, in combination with any signal added or subtracted by the summer circuit 910.

The delay circuit 930 includes two or more delay cells. The multiplication circuit 940 includes two or more multipliers. A processed data stream generated by the slicer circuit 920 is input to the delay circuit 930. The delay cells generate respective delayed versions of the processed data stream. The delayed versions of the processed data stream are input to respective multipliers, where they are multiplied (weighted) with respective DFE weighting coefficients. The outputs of the multipliers are summed in the summer circuit 910.

As DFE does not generate residual ISI at trailing cursor positions, only one tap at the $(N*M)^{th}$ location may be enough to mitigate or substantially cancel the T/H circuit's induced ISI. In this depicted example, an E'-tap DFE 520a in a fully serial processing form is shown, where E'=E+C, E taps are used to enable the DFE 520a to achieve a predetermined bit error rate (BER) and/or maximum eye opening of an eye diagram of a recovered/equalized signal, and the C taps are the newly added number of taps to expand the E-tap DFE's equalization cover range to cover the ISI induced at the $(N*M)^{th}$ UI, C≥1. In some implementations, at least one tap may be sufficient to mitigate the T/H circuit induced ISI at the N×Mth UI, certain embodiments may further include additional taps beyond the N×Mth cursor to provide other performance criteria.

Figure 9B:
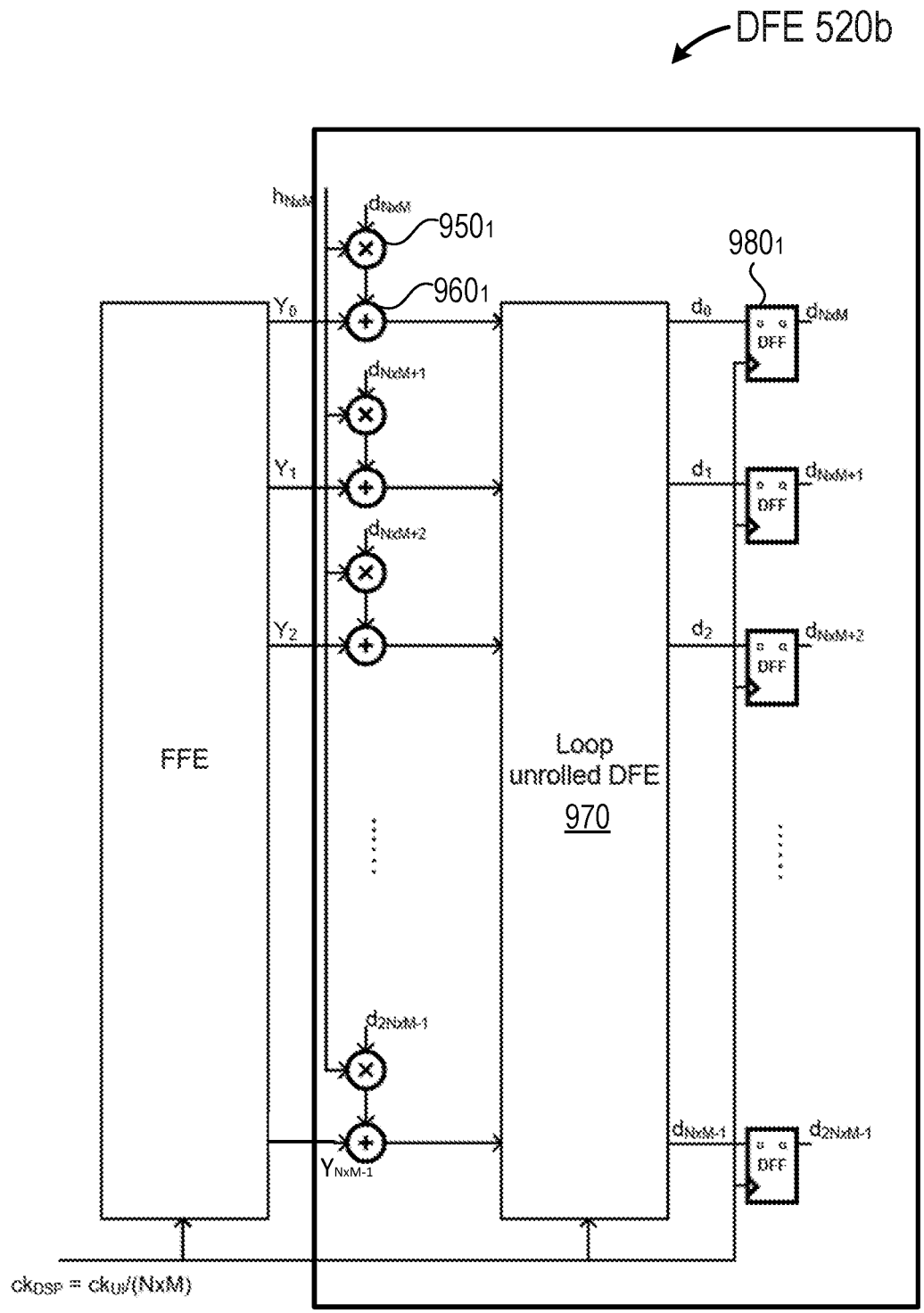
FIG. 9B depicts a second exemplary architecture of an exemplary decision feedback equalizer (DFE) in the DSP.

FIG. 9B depicts a second exemplary architecture of an exemplary decision feedback equalizer (DFE) in the DSP. As discussed with reference to FIG. 6B, the data received by the DSP may be already retimed and deserialized, thus a DFE may also be able to process data in a parallelized fashion. In this depicted example, the DFE 520b includes a number of multipliers (e.g., multiplier 9501 . . . ) and a number of summers (e.g., summer $960_1, \ldots$). The DFE 520b also includes a one-tap loop unrolled DFE 970 and a number of flip-flops (e.g., flip-flop $980_1 \ldots$). The number of flip-flops after the sliced output data clocked with the sub-sampled DSP clock signal will be used to create the necessary samples for the DFE at the $(N*M)^{th}$ location. In some embodiments, for the flip-flops implemented in the FFE 510b and the FFE 520b, the flopped data may go back to its own data branch, thus no routings between each flip-flop and other data branch is needed. In various embodiments, each dN×M may be considered to be a delayed version of d0, which may be functionally the same as the output of the Eth+Cth tap in FIG. 9A.

In the depicted architecture of FIG. 9B, the DFE takes the postcursor data and subtracts its ISI contribution on the sample of interest weighted by a coefficient. Therefore, a typical implementation of a DFE (e.g., serial version) may have a feedback structure. Delays on output data d[0:N×M−1] may generate the appropriate data with N×M delay to be fed back to the input of the DFE. The output data bus d[N×M:2N×M−1] may correspond to the output of the N×Mth delay tap in a parallelized fashion.

Thus, by configuring the DFE to have a parallelized processing fashion, less delay cells may be used such that the induced ISI may be mitigated to a negligible level without incurring substantial excessive power and area penalty.

Figure 10:
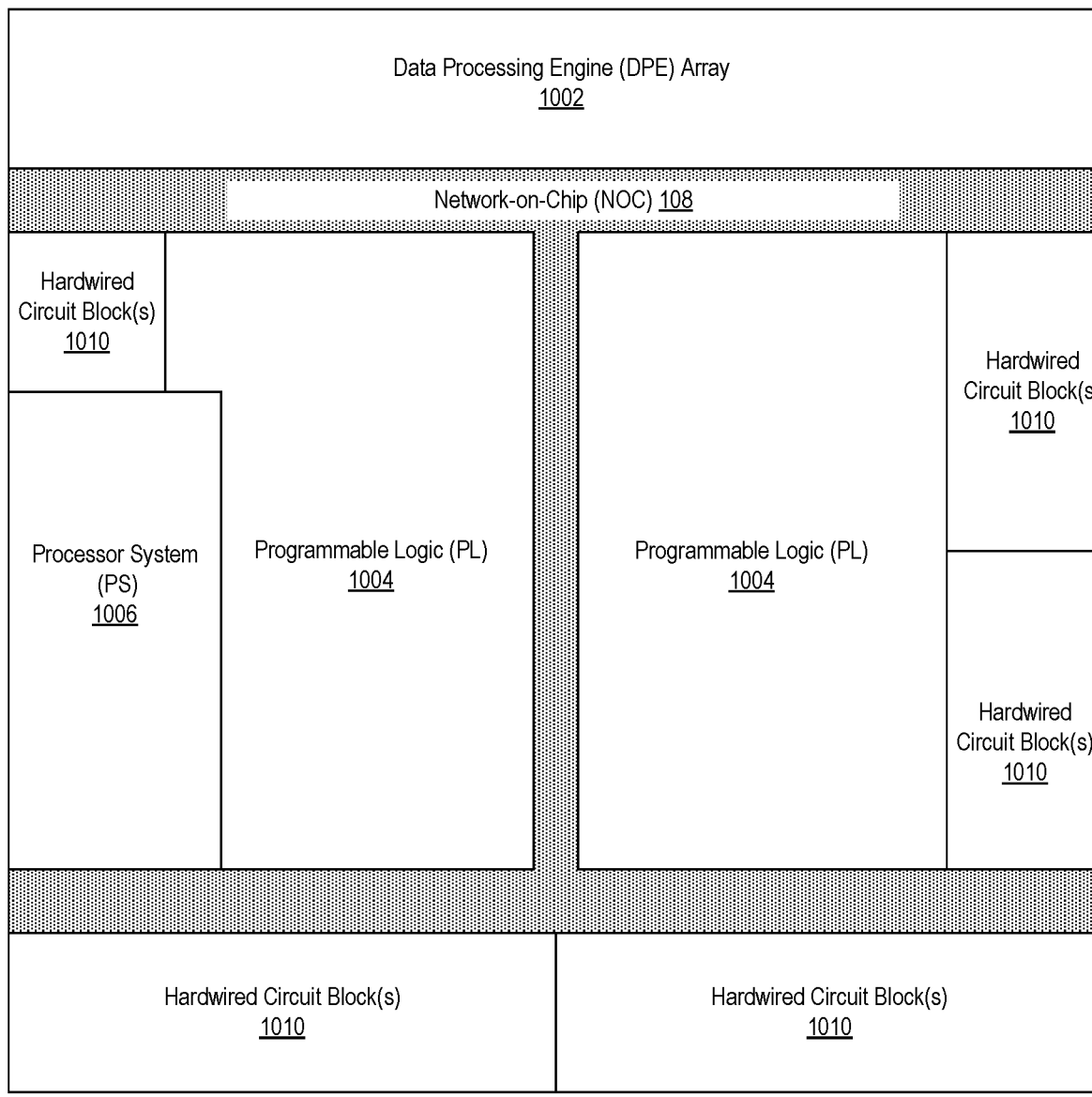
FIG. 10 illustrates another exemplary architecture for a System-on-Chip (SOC) on which the disclosed circuits and processes may be implemented.

FIG. 10 illustrates another example architecture for a System-on-Chip (SOC) on which the disclosed circuits and processes may be implemented. A SOC 1000 is an example of a programmable IC and an integrated programmable device platform. In the example of FIG. 10, the various, different subsystems or regions of the SOC 1000 illustrated may be implemented on a single die provided within a single integrated package. In other examples, the different subsystems may be implemented on two or more interconnected dies provided as a single, integrated package.

In the example, the SOC 1000 includes two or more regions having circuitry with different functionalities. In the example, the SOC 1000 optionally includes a data processing engine (DPE) array 1002. The SOC 1000 includes programmable logic (PL) regions 1004 (hereafter PL region(s) or PL), a processing system (PS) 1006, a Network-on-Chip (NOC) 1008, and one or more hardwired circuit blocks 1010. The DPE array 1002 is implemented as two or more interconnected, hardwired, and programmable processors having an interface to the other regions of the SOC 1000.

The PL 1004 is circuitry that may be programmed to perform specified functions. As an example, the PL 1004 may be implemented as field programmable gate array type of circuitry. The PL 1004 can include an array of programmable circuit blocks. Examples of programmable circuit blocks within the PL 1004 include, but are not limited to, configurable logic blocks (CLBs), dedicated random access memory blocks (BRAM and/or UltraRAM or URAM), digital signal processing blocks (DSPs), clock managers, and/or delay lock loops (DLLs).

Each programmable circuit block within the PL 1004 typically includes both programmable interconnect circuitry and programmable logic circuitry. The programmable interconnect circuitry typically includes a large number of interconnect wires of varying lengths interconnected by programmable interconnect points (PIPs). Typically, the interconnect wires are configured (e.g., on a per wire basis) to provide connectivity on a per-bit basis (e.g., where each wire conveys a single bit of information). The programmable logic circuitry implements the logic of a user design using programmable elements that may include, for example, look-up tables, registers, arithmetic logic, and so forth. The programmable interconnect and programmable logic circuitries may be programmed by loading configuration data into internal configuration memory cells that define how the programmable elements are configured and operate.

The PS 1006 is implemented as hardwired circuitry that is fabricated as part of the SOC 1000. The PS 1006 may be implemented as, or include, any of a variety of different processor types each capable of executing program code. For example, the PS 1006 may be implemented as an individual processor, e.g., a single core capable of executing program code. In another example, the PS 1006 may be implemented as a multicore processor. In still another example, the PS 1006 may include one or more cores, modules, co-processors, interfaces, and/or other resources. The PS 1006 may be implemented using any of a variety of different types of architectures. Example architectures that may be used to implement the PS 1006 may include, but are not limited to, an ARM processor architecture, an x86 processor architecture, a GPU architecture, a mobile processor architecture, a DSP architecture, or other suitable architecture that is capable of executing computer-readable instructions or program code.

NOC 1008 includes an interconnecting network for sharing data between endpoint circuits in the SOC 1000. The endpoint circuits can be disposed in the DPE array 1002, the PL regions 1004, the PS 1006, and/or in the hardwired circuit blocks 1010. The NOC 1008 can include high-speed data paths with dedicated switching. In an example, the NOC 1008 includes horizontal paths, vertical paths, or both horizontal and vertical paths. The arrangement and number of regions shown in FIG. 10 is merely an example. The NOC 1008 is an example of the common infrastructure that is available within the SOC 1000 to connect selected components and/or subsystems.

The NOC 1008 provides connectivity to the PL 1004, the PS 1006, and to selected ones of the hardwired circuit blocks 1010. The NOC 1008 is programmable. In the case of a programmable NOC used with other programmable circuitry, the nets that are to be routed through the NOC 1008 are unknown until a user circuit design is created for implementation within the SOC 1000. The NOC 1008 may be programmed by loading configuration data into internal configuration registers that define how elements within the NOC 1008 such as switches and interfaces are configured and operate to pass data from switch to switch and among the NOC interfaces.

The NOC 1008 is fabricated as part of the SOC 1000 and while not physically modifiable, may be programmed to establish connectivity between different master circuits and different slave circuits of a user circuit design. The NOC 1008, for example, may include two or more programmable switches that are capable of establishing packet switched network connecting user specified master circuits and slave circuits. In this regard, the NOC 1008 is capable of adapting to different circuit designs, where each different circuit design has different combinations of master circuits and slave circuits implemented at different locations in the SOC 1000 that may be coupled by the NOC 1008. The NOC 1008 may be programmed to route data, e.g., application data and/or configuration data, among the master and slave circuits of the user circuit design. For example, the NOC 1008 may be programmed to couple different user-specified circuitry implemented within the PL 1004 with the PS 1006, and/or the DPE array 1002, with different hardwired circuit blocks, and/or with different circuits and/or systems external to the SOC 1000.

The hardwired circuit blocks 1010 may include input/output (I/O) blocks, and/or transceivers for sending and receiving signals to circuits and/or systems external to the SOC 1000, memory controllers, or the like. Examples of different I/O blocks may include single-ended and pseudo differential I/Os and high-speed differentially clocked transceivers. Further, the hardwired circuit blocks 1010 may be implemented to perform specific functions. Examples of the hardwired circuit blocks 1010 include, but are not limited to, cryptographic engines, digital-to-analog converters, analog-to-digital converters, and the like. The hardwired circuit blocks 1010 within the SOC 1000 may be referred to herein from time-to-time as application-specific blocks.

In the example of FIG. 10, the PL 1004 is shown in two separate regions. In another example, the PL 1004 may be implemented as a unified region of programmable circuitry. In still another example, the PL 1004 may be implemented as more than two different regions of programmable circuitry. The particular organization of the PL 1004 is not intended as a limitation. In this regard, the SOC 1000 includes one or more PL regions 1004, the PS 1006, and the NOC 1008. The DPE array 1002 may be optionally included.

In other example implementations, the SOC 1000 may include two or more DPE arrays 1002 located in different regions of the IC. In still other examples, the SOC 1000 may be implemented as a multi-die IC. In that case, each subsystem may be implemented on a different die. The different dies may be communicatively linked using any of a variety of available multi-die IC technologies such stacking the dies side-by-side on an interposer, using a stacked-die architecture where the IC is implemented as a Multi-Chip Module (MCM), or the like. In the multi-die IC example, it should be appreciated that each die may include single subsystem, two or more subsystems, a subsystem and another partial subsystem, or any combination thereof.

A programmable integrated circuit (IC) refers to a type of device that includes programmable logic. An example of a programmable device or IC is a field programmable gate array (FPGA). An FPGA is characterized by the inclusion of programmable circuit blocks. Examples of programmable circuit blocks include, but are not limited to, input/output blocks (OBs), configurable logic blocks (CLBs), dedicated random access memory blocks (BRAM), digital signal processing blocks (DSPs), processors, clock managers, and delay lock loops (DLLs). Modern programmable ICs have evolved to include programmable logic in combination with one or more other subsystems. For example, some programmable ICs have evolved into System-on-Chips or "SOCs" that include both programmable logic and a hardwired processor. Other varieties of programmable ICs include additional and/or different subsystems.

Although various embodiments may be implemented using reconfigurable programmable logic blocks (e.g., FPGA), other embodiments may be implemented in fixed instantiations (e.g., ASIC), or combined in a single integrated circuit (e.g., SOC) with programmable logic. While dedicated hard block circuitry in an ASIC implementation may not be reconfigurable once instantiated in an integrated circuit, for example, an ASIC implementation may, in some implementations, provide for a minimized platform with respect to, for example, power consumption and/or die area.

Although various embodiments have been described with reference to the figures, other embodiments are possible. For example, various illustrative examples herein have focused on N×Mi interleave structure where i=1 (effectively creating two ranks, N×M) and, thus, additional taps to cover the ISI induced by T/H at the N×M1th UI. As discussed in reference to FIG. 4B, however, the Nth UI is also affected by T/H induced ISI, but is not targeted by extra taps because the induced ISI is within the normal FFE's correction range. In some embodiments, however, there may be more than two ranks. For example, in an illustrative interleave structure with three ranks (i=2), N, M1, and M2, the T/H induced ISI may be mainly at the Nth, N×M1th, and N×M1×M2th UI. Accordingly, additional taps may be added at the N×M1th and N×M1×M2th cursors. For example, if N=4, M1=8, and M2=2, no additional taps will be added at the $4^{th}$ UI, but additional taps will be added at the $4 \times 8=32^{nd}$ UI and at the $4 \times 8 \times 2=64^{th}$ UI. In a more generalized example embodiment, for Mi additional ranks, additional taps may be added to cover T/H induced ISI at each N×M1 . . . ×Mi UI. For example, where i=3 (N1, M1, M2, and M3 ranks), additional taps may not be added to cover the Nth UI, but additional taps may be added to cover the N×M1th, N×M1×M2th, and N×M1×M2×M3th intervals. In various embodiments, additional taps may be added to at least one FFE, to at least one DFE, or some combination thereof.

Various examples may be implemented using circuitry, including various electronic hardware. By way of example and not limitation, the hardware may include transistors, resistors, capacitors, switches, integrated circuits and/or other devices. In various examples, the circuits may include analog and/or digital logic, discrete components, traces and/or memory circuits fabricated on a silicon substrate including various integrated circuits (e.g., FPGAs, ASICs). In some embodiments, the circuits may involve execution of preprogrammed instructions and/or software executed by a processor. For example, various systems may involve both hardware and software.

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a fixed hardware processor; and methods can be performed by a programmable processor executing a program of instructions to perform functions of various embodiments by operating on input data and generating an output. Some embodiments may be implemented advantageously in one or more computer programs that are executable on a programmable system including at least one processor coupled to receive data and instructions from, and to transmit data and instructions to, a data store, at least one input, and/or at least one output. A data store may include one or more registers or memory locations in, for example, a memory space. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other units suitable for use in a computing environment.

In various embodiments, a computer system may include non-transitory memory. The memory may be connected to the one or more processors, which may be configured for storing data and computer readable instructions, including processor executable program instructions. The data and computer readable instructions may be accessible to the one or more processors. The processor executable program instructions, when executed by the one or more processors, may cause the one or more processors to perform various operations.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. An apparatus to compensate a component of intersymbol interference (ISI), the component being a function of the depth and rank size of a sampling network, the apparatus comprising:
a time-interleaved (TI) analog-to-digital converter (ADC) system configured to receive an incoming data signal via a transmission channel and convert the incoming data signal into a digital data signal in response to a sampling clock signal, the TI-ADC system comprising:
a sampling front-end circuit having X sampling layers, wherein a first sampling layer of the X sampling layers comprises N track-and-hold circuits, and each $i^{th}$ sampling layer having $M_i$ track-and-hold circuits coupled to a track-and-hold circuit in the $(i-1)^{th}$ sampling layer, $2 \leq i \leq X$; and,
N*M ADCs, $M=M_2*M_3* \ldots *M_x$, wherein each ADC of the N*M ADCs is coupled to a corresponding track-and-hold circuit in the $X^{th}$ sampling layer, an inter-symbol interference (ISI) mitigation module coupled to an output of the TI-ADC system and configured to receive the digital data signal from TI-ADC system and generate a recovered signal, wherein the ISI mitigation module is configured to have a first predetermined number of taps such that the ISI mitigation module is operable to filter the received digital data substantially in accordance with an inverse transfer-function of the transmission channel, wherein the ISI mitigation module is further configured to have a second predetermined number of taps such that the ISI mitigation module has an equalization range that covers at least an $(N*M)^{th}$ unit interval (UI).

2. The apparatus of claim 1, wherein the ISI mitigation module comprises a feed forward equalizer (FFE) coupled to the output of the TI-ADC system.

3. The apparatus of claim 2, wherein the first predetermined number of taps is the sum of a predetermined number (J) of precursor taps and a predetermined number (K) of post-cursor taps, wherein the second predetermined number of taps is J+K+1+N×M+B taps.

4. The apparatus of claim 2, wherein the ISI mitigation module further comprises: a decision feedback equalizer (DFE), having a second predetermined number of taps, coupled to an output of the FFE.

5. The apparatus of claim 4, wherein the first predetermined number of taps is the sum of a predetermined number (J) of precursor taps and a predetermined number (K) of post-cursor taps, wherein the second predetermined number of taps is (N*M−(J+K)).

6. The apparatus of claim 1, further comprising: a continuous time-linear equalizer (CTLE) configured to receive the incoming data signal and generate a first equalized signal, wherein the ADC system is coupled to an output of the CTLE.

7. The apparatus of claim 1, wherein the ISI mitigation module is configured to have a first predetermined number of taps such that the ISI mitigation module is operable to filter the received digital data substantially in accordance with an inverse transfer-function of the transmission channel further comprises the ISI mitigation module is configured to achieve a predetermined bit error rate (BER) or maximum eye opening of an eye diagram of the recovered signal.

8. The apparatus of claim 1, wherein X=3.

9. The apparatus of claim 1, wherein X>3.

10. The apparatus of claim 1, wherein the first predetermined number of taps is the sum of a predetermined number (J) of precursor taps and a predetermined number (K) of post-cursor taps, wherein the second predetermined number of taps is (N*M−(J+K)).

11. An apparatus to compensate a component of intersymbol interference (ISI), the component being a function of the depth and rank size of a sampling network, the apparatus comprising:

an inter-symbol interference (ISI) mitigation module adapted to operatively couple to an output of a time-interleaved (TI) analog-to-digital converter (ADC) system and to receive a digital data signal from the TI-ADC system, and, in response to the received digital signal, generate a recovered signal, wherein the TI-ADC system is configured to receive an incoming data signal via a transmission channel and convert the incoming data signal into the digital data signal in response to a sampling clock signal, the TI-ADC system comprising:

(i) a sampling front-end circuit having X sampling layers, wherein a first sampling layer of the X sampling layers comprises N track-and-hold circuits, and each $i^{th}$ sampling layer having $M_i$ track-and-hold circuits coupled to a track-and-hold circuit in the $(i-1)^{th}$ sampling layer, $2 \geq i \leq X$, and, (ii) N*M ADCs, $M=M_2*M_3* \ldots *M_x$, wherein each ADC of the N*M ADCs is coupled to a corresponding track-and-hold circuit in the $X^{th}$ sampling layer, wherein the ISI mitigation module is further configured to have a first predetermined number of taps such that the ISI mitigation module is operable to filter the received digital data substantially in accordance with an inverse transfer-function of the transmission channel, and wherein the ISI mitigation module is further configured to have a second predetermined number of taps such that the ISI mitigation module has an equalization range that covers an $(N*M)^{th}$ unit interval (UI).

12. The apparatus of claim 11, wherein the ISI mitigation module comprises a feed forward equalizer (FFE) coupled to the output of the TI-ADC system.

13. The apparatus of claim 12, wherein The apparatus of claim 1, wherein the first predetermined number of taps is the sum of a predetermined number (J) of precursor taps and a predetermined number (K) of post-cursor taps, wherein the second predetermined number of taps is (N*M−(J+K)).

14. The apparatus of claim 11, wherein the ISI mitigation module further comprises: a decision feedback equalizer (DFE), having a second predetermined number of taps, coupled to an output of the FFE.

15. The apparatus of claim 14, wherein the first predetermined number of taps is the sum of a predetermined number (J) of precursor taps and a predetermined number (K) of post-cursor taps, wherein the second predetermined number of taps is (N*M−(J+K)).

16. The apparatus of claim 1, wherein X=2.

17. A method to compensate a component of intersymbol interference (ISI), the component being a function of the depth and rank size of a sampling network, the method comprising:

providing a time-interleaved (TI) analog-to-digital converter (ADC) system configured to receive an incoming data signal via a transmission channel and convert the incoming data signal into a digital data signal in response to a sampling clock signal, the TI-ADC system comprising:

(i) providing a sampling front-end circuit having X sampling layers, wherein a first sampling layer of the X sampling layers comprises N track-and-hold circuits, and each $i^{th}$ sampling layer having $M_i$ track-and-hold circuits coupled to a track-and-hold circuit in the $(i-1)^{th}$ sampling layer, $2 \leq i \leq X$; and, (ii) N*M ADCs, $M=M_2*M_3* \ldots *M_x$, wherein each ADC of the N*M ADCs is coupled to a corresponding track-and-hold circuit in the $X^{th}$ sampling layer; and, providing an inter-symbol interference (ISI) mitigation module coupled to an output of the TI-ADC system and configured to receive the digital data signal from TI-ADC system and generate a recovered signal, wherein the ISI mitigation module is configured to have a first predetermined number of taps such that the ISI mitigation module is operable to filter the received digital data substantially in accordance with an inverse transfer-function of the transmission channel, wherein the ISI mitigation module is further configured to have a second predetermined number of taps such that the ISI mitigation module has an equalization range that covers an $(N*M)^{th}$ unit interval (UI).

18. The method of claim 17, wherein the ISI mitigation module comprises a feed forward equalizer (FFE) coupled to the output of the TI-ADC system.

19. The method of claim 17, wherein X<4.

20. The method of claim 17, wherein the first predetermined number of taps is the sum of a predetermined number (J) of precursor taps and a predetermined number (K) of post-cursor taps, wherein the second predetermined number of taps is (N*M−(J+K)).

* * * * *